(12) United States Patent
Stopler et al.

(10) Patent No.: US 9,246,523 B1
(45) Date of Patent: Jan. 26, 2016

(54) TRANSMITTER SIGNAL SHAPING

(71) Applicant: MagnaCom Ltd., Petach Tikva (IL)

(72) Inventors: Daniel Stopler, Holon (IL); Amir Eliaz, Moshav Ben Shemen (IL)

(73) Assignee: MagnaCom Ltd. (IL)

( * ) Notice: Subject to any disclaimer, the term of this patent is extended or adjusted under 35 U.S.C. 154(b) by 0 days.

(21) Appl. No.: 14/687,861

(22) Filed: Apr. 15, 2015

Related U.S. Application Data

(60) Provisional application No. 62/042,356, filed on Aug. 27, 2014, provisional application No. 62/126,881, filed on Mar. 2, 2015.

(51) Int. Cl.
*H04B 1/04* (2006.01)
*H04L 1/00* (2006.01)

(52) U.S. Cl.
CPC ............ *H04B 1/0458* (2013.01); *H04L 1/0042* (2013.01); *H04B 2001/0425* (2013.01)

(58) Field of Classification Search
CPC ...... H04B 1/04; H04B 1/0408; H04B 1/0425; H04B 1/0458; H04B 2001/0425; H04L 1/0042; H04J 1/00; H04J 1/02; H04J 1/04
USPC ................. 375/260, 278, 284, 285, 295–297; 330/149; 370/208, 210, 319, 344; 381/94.1, 94.4, 94.7, 119, 120; 455/67.13, 114.2, 114.3
See application file for complete search history.

(56) References Cited

U.S. PATENT DOCUMENTS

| | | | |
|---|---|---|---|
| 4,109,101 | A | 8/1978 | Mitani |
| 4,135,057 | A | 1/1979 | Bayless, Sr. et al. |
| 4,797,925 | A | 1/1989 | Lin |
| 5,111,484 | A | 5/1992 | Karabinis |

(Continued)

FOREIGN PATENT DOCUMENTS

| | | |
|---|---|---|
| CN | 1710894 A | 12/2005 |
| CN | 101562589 A | 10/2009 |

(Continued)

OTHER PUBLICATIONS

Equalization: The Correction and Analysis of Degraded Signals, White Paper, Agilent Technologies, Ransom Stephens V1.0, Aug. 15, 2005 (12 pages).

(Continued)

*Primary Examiner* — Young T Tse
(74) *Attorney, Agent, or Firm* — McAndrews, Held & Malloy, Ltd.

(57) ABSTRACT

A transmitter comprises at least one nonlinear circuit, and a power spectral density (PSD) shaping circuit. The PSD shaping circuit is operable to receive a symbol of a modulated signal, wherein the symbol corresponds to a first one or more frequency bins. The PSD shaping circuit is operable to perform iterative processing of the symbol, wherein each iteration of the processing comprises: generation of a pre-distortion signal based on a model of the at least one nonlinear circuit, wherein the nonlinearly distorted signal corresponds to a second one or more frequency bins; and combination of the symbol, or a pre-distorted version of the symbol, with the nonlinearly-distorted signal. The generation of the pre-distorted signal may comprise generation of a nonlinearly-distorted signal, and adjustment of one or more components of the nonlinearly-distorted signal.

27 Claims, 10 Drawing Sheets

(56) References Cited

U.S. PATENT DOCUMENTS

| | | |
|---|---|---|
| 5,131,011 A | 7/1992 | Bergmans et al. |
| 5,202,903 A | 4/1993 | Okanoue |
| 5,249,200 A | 9/1993 | Chen et al. |
| 5,283,813 A | 2/1994 | Shalvi et al. |
| 5,291,516 A | 3/1994 | Dixon et al. |
| 5,394,439 A | 2/1995 | Hemmati |
| 5,432,822 A | 7/1995 | Kaewell, Jr. |
| 5,459,762 A | 10/1995 | Wang et al. |
| 5,590,121 A | 12/1996 | Geigel et al. |
| 5,602,507 A | 2/1997 | Suzuki |
| 5,710,792 A | 1/1998 | Fukawa et al. |
| 5,757,855 A | 5/1998 | Strolle et al. |
| 5,784,415 A | 7/1998 | Chevillat et al. |
| 5,818,653 A | 10/1998 | Park et al. |
| 5,886,748 A | 3/1999 | Lee |
| 5,889,823 A | 3/1999 | Agazzi et al. |
| 5,915,213 A | 6/1999 | Iwatsuki et al. |
| 5,930,309 A | 7/1999 | Knutson et al. |
| 5,946,359 A | 8/1999 | Tajiri et al. |
| 6,009,120 A | 12/1999 | Nobakht |
| 6,167,079 A | 12/2000 | Kinnunen et al. |
| 6,233,709 B1 | 5/2001 | Zhang et al. |
| 6,272,173 B1 | 8/2001 | Hatamian |
| 6,335,954 B1 | 1/2002 | Bottomley et al. |
| 6,356,586 B1 | 3/2002 | Krishnamoorthy et al. |
| 6,516,025 B1 | 2/2003 | Warke et al. |
| 6,516,437 B1 | 2/2003 | Van Stralen et al. |
| 6,529,303 B1 | 3/2003 | Rowan et al. |
| 6,532,256 B2 | 3/2003 | Miller |
| 6,535,549 B1 | 3/2003 | Scott et al. |
| 6,591,090 B1 | 7/2003 | Vuorio et al. |
| 6,608,873 B1 | 8/2003 | Spinnler et al. |
| 6,675,184 B1 | 1/2004 | Matsui |
| 6,690,754 B1 | 2/2004 | Haratsch et al. |
| 6,697,441 B1 | 2/2004 | Bottomley et al. |
| 6,718,165 B1 | 4/2004 | Ha |
| 6,785,342 B1 | 8/2004 | Isaksen et al. |
| 6,871,208 B1 | 3/2005 | Guo et al. |
| 6,968,021 B1 | 11/2005 | White et al. |
| 6,985,709 B2 | 1/2006 | Perets |
| 7,158,324 B2 | 1/2007 | Stein et al. |
| 7,190,288 B2 | 3/2007 | Robinson et al. |
| 7,190,721 B2 | 3/2007 | Garrett |
| 7,205,798 B1 | 4/2007 | Agarwal et al. |
| 7,206,363 B2 | 4/2007 | Hegde et al. |
| 7,215,716 B1 | 5/2007 | Smith |
| 7,269,205 B2 | 9/2007 | Wang |
| 7,286,598 B2 | 10/2007 | Kochale |
| 7,318,185 B2 | 1/2008 | Khandani et al. |
| 7,333,561 B2 | 2/2008 | Pinckley |
| 7,336,716 B2 | 2/2008 | Maltsev et al. |
| 7,463,697 B2 | 12/2008 | Maltsev et al. |
| 7,467,338 B2 | 12/2008 | Saul |
| 7,583,755 B2 | 9/2009 | Ma et al. |
| 7,830,854 B1 | 11/2010 | Sarkar et al. |
| 7,924,956 B2 | 4/2011 | Maltsev et al. |
| 7,974,230 B1 | 7/2011 | Talley et al. |
| 8,005,170 B2 | 8/2011 | Lee et al. |
| 8,059,737 B2 | 11/2011 | Yang |
| 8,175,186 B1 | 5/2012 | Wiss et al. |
| 8,175,201 B2 | 5/2012 | Mathew et al. |
| 8,199,804 B1 | 6/2012 | Cheong |
| 8,248,975 B2 | 8/2012 | Fujita et al. |
| 8,265,561 B2 | 9/2012 | Nakamura |
| 8,331,500 B2 | 12/2012 | Choi et al. |
| 8,351,536 B2 | 1/2013 | Mazet et al. |
| 8,422,589 B2 | 4/2013 | Golitschek Edler Von Elbwart et al. |
| 8,427,935 B2 | 4/2013 | Van de Beek et al. |
| 8,432,987 B2 | 4/2013 | Siti et al. |
| 8,498,591 B1 | 7/2013 | Qian et al. |
| 8,519,789 B2 | 8/2013 | Hawkes |
| 8,526,523 B1 | 9/2013 | Eliaz |
| 8,548,072 B1 | 10/2013 | Eliaz |
| 8,548,089 B2 | 10/2013 | Agazzi et al. |
| 8,548,097 B1 | 10/2013 | Eliaz |
| 8,553,821 B1 | 10/2013 | Eliaz |
| 8,559,494 B1 | 10/2013 | Eliaz |
| 8,559,496 B1 | 10/2013 | Eliaz |
| 8,559,498 B1 | 10/2013 | Eliaz |
| 8,565,363 B1 | 10/2013 | Eliaz |
| 8,566,687 B1 | 10/2013 | Eliaz |
| 8,571,131 B1 | 10/2013 | Eliaz |
| 8,571,146 B1 | 10/2013 | Eliaz |
| 8,572,458 B1 | 10/2013 | Eliaz |
| 8,582,637 B1 | 11/2013 | Eliaz |
| 8,599,914 B1 | 12/2013 | Eliaz |
| 8,605,832 B1 | 12/2013 | Eliaz |
| 8,665,941 B1 | 3/2014 | Eliaz |
| 8,665,992 B1 | 3/2014 | Eliaz |
| 8,666,000 B2 | 3/2014 | Eliaz |
| 8,675,769 B1 | 3/2014 | Eliaz |
| 8,675,782 B2 | 3/2014 | Eliaz |
| 8,681,889 B2 | 3/2014 | Eliaz |
| 8,731,413 B1 | 5/2014 | Dave et al. |
| 8,737,458 B2 | 5/2014 | Eliaz |
| 8,744,003 B2 | 6/2014 | Eliaz |
| 8,744,009 B2 | 6/2014 | Kleider et al. |
| 8,774,738 B2 | 7/2014 | Dakshinamurthy et al. |
| 8,781,008 B2 | 7/2014 | Eliaz |
| 8,804,879 B1 | 8/2014 | Eliaz |
| 8,811,548 B2 | 8/2014 | Eliaz |
| 8,824,572 B2 | 9/2014 | Eliaz |
| 8,824,599 B1 | 9/2014 | Eliaz |
| 8,824,611 B2 | 9/2014 | Eliaz |
| 8,831,124 B2 | 9/2014 | Eliaz |
| 8,842,778 B2 | 9/2014 | Eliaz |
| 8,873,612 B1 | 10/2014 | Eliaz |
| 8,885,698 B2 | 11/2014 | Eliaz |
| 8,885,786 B2 | 11/2014 | Eliaz |
| 8,891,701 B1 | 11/2014 | Eliaz |
| 8,897,387 B1 | 11/2014 | Eliaz |
| 8,897,405 B2 | 11/2014 | Eliaz |
| 8,948,321 B2 | 2/2015 | Eliaz |
| 8,972,836 B2 | 3/2015 | Eliaz |
| 8,976,853 B2 | 3/2015 | Eliaz |
| 8,976,911 B2 | 3/2015 | Eliaz |
| 8,982,984 B2 | 3/2015 | Eliaz |
| 8,989,249 B2 | 3/2015 | Zerbe et al. |
| 9,003,258 B2 | 4/2015 | Eliaz |
| 9,071,305 B2 | 6/2015 | Eliaz |
| 9,088,400 B2 | 7/2015 | Eliaz |
| 9,088,469 B2 | 7/2015 | Eliaz |
| 9,094,269 B2 | 7/2015 | Ling |
| 9,100,071 B2 | 8/2015 | Eliaz |
| 9,106,292 B2 | 8/2015 | Eliaz |
| 9,118,519 B2 | 8/2015 | Eliaz |
| 9,124,399 B2 | 9/2015 | Eliaz |
| 9,130,627 B2 | 9/2015 | Eliaz |
| 9,130,637 B2 | 9/2015 | Eliaz |
| 9,130,795 B2 | 9/2015 | Eliaz |
| 9,137,057 B2 | 9/2015 | Eliaz |
| 9,166,833 B2 | 10/2015 | Eliaz |
| 9,166,834 B2 | 10/2015 | Eliaz |
| 2001/0008542 A1 | 7/2001 | Wiebke et al. |
| 2001/0036151 A1 | 11/2001 | Cimini et al. |
| 2002/0016938 A1 | 2/2002 | Starr |
| 2002/0060827 A1 | 5/2002 | Agazzi et al. |
| 2002/0123318 A1 | 9/2002 | Lagarrigue |
| 2002/0150065 A1 | 10/2002 | Ponnekanti |
| 2002/0150184 A1 | 10/2002 | Hafeez et al. |
| 2002/0172297 A1 | 11/2002 | Ouchi et al. |
| 2003/0016741 A1 | 1/2003 | Sasson et al. |
| 2003/0132814 A1 | 7/2003 | Nyberg |
| 2003/0135809 A1 | 7/2003 | Kim |
| 2003/0207680 A1 | 11/2003 | Yang et al. |
| 2003/0210352 A1 | 11/2003 | Fitzsimmons et al. |
| 2003/0227981 A1 | 12/2003 | Vella-Coleiro |
| 2004/0008616 A1 | 1/2004 | Jung et al. |
| 2004/0009783 A1 | 1/2004 | Miyoshi |
| 2004/0037374 A1 | 2/2004 | Gonikberg |
| 2004/0081259 A1 | 4/2004 | Ammer et al. |
| 2004/0086276 A1 | 5/2004 | Lenosky |
| 2004/0120409 A1 | 6/2004 | Yasotharan et al. |

(56) References Cited

U.S. PATENT DOCUMENTS

| | | |
|---|---|---|
| 2004/0142666 A1 | 7/2004 | Creigh et al. |
| 2004/0170228 A1 | 9/2004 | Vadde |
| 2004/0174937 A1 | 9/2004 | Ungerboeck |
| 2004/0203458 A1 | 10/2004 | Nigra |
| 2004/0227570 A1 | 11/2004 | Jackson et al. |
| 2004/0240578 A1 | 12/2004 | Thesling |
| 2004/0257955 A1 | 12/2004 | Yamanaka |
| 2005/0032472 A1 | 2/2005 | Jiang et al. |
| 2005/0047517 A1 | 3/2005 | Georgios et al. |
| 2005/0089125 A1 | 4/2005 | Zhidkov |
| 2005/0123077 A1 | 6/2005 | Kim |
| 2005/0135472 A1 | 6/2005 | Higashino |
| 2005/0163252 A1 | 7/2005 | McCallister et al. |
| 2005/0193318 A1 | 9/2005 | Okumura et al. |
| 2005/0219089 A1 | 10/2005 | Batruni |
| 2005/0220218 A1 | 10/2005 | Jensen et al. |
| 2005/0265470 A1 | 12/2005 | Kishigami et al. |
| 2005/0276317 A1 | 12/2005 | Jeong et al. |
| 2006/0034378 A1 | 2/2006 | Lindskog et al. |
| 2006/0067396 A1 | 3/2006 | Christensen |
| 2006/0109780 A1 | 5/2006 | Fechtel |
| 2006/0109935 A1 | 5/2006 | McQueen et al. |
| 2006/0171489 A1 | 8/2006 | Ghosh et al. |
| 2006/0176948 A1 | 8/2006 | Lee |
| 2006/0203943 A1 | 9/2006 | Scheim et al. |
| 2006/0239339 A1 | 10/2006 | Brown et al. |
| 2006/0245346 A1 | 11/2006 | Bar-Ness et al. |
| 2006/0245765 A1 | 11/2006 | Elahmadi et al. |
| 2006/0280113 A1 | 12/2006 | Huo |
| 2007/0047121 A1 | 3/2007 | Eleftheriou et al. |
| 2007/0089015 A1* | 4/2007 | Saul .............. H04L 27/2624 714/746 |
| 2007/0092017 A1 | 4/2007 | Abedi |
| 2007/0098059 A1 | 5/2007 | Ives et al. |
| 2007/0098090 A1 | 5/2007 | Ma et al. |
| 2007/0098116 A1 | 5/2007 | Kim et al. |
| 2007/0110177 A1 | 5/2007 | Molander et al. |
| 2007/0110191 A1 | 5/2007 | Kim et al. |
| 2007/0127608 A1 | 6/2007 | Scheim et al. |
| 2007/0140330 A1 | 6/2007 | Allpress et al. |
| 2007/0189404 A1 | 8/2007 | Baum et al. |
| 2007/0213087 A1 | 9/2007 | Laroia et al. |
| 2007/0230593 A1 | 10/2007 | Eliaz et al. |
| 2007/0258517 A1 | 11/2007 | Rollings et al. |
| 2007/0291719 A1 | 12/2007 | Demirhan et al. |
| 2008/0002789 A1 | 1/2008 | Jao et al. |
| 2008/0049598 A1 | 2/2008 | Ma et al. |
| 2008/0080644 A1 | 4/2008 | Batruni |
| 2008/0130716 A1 | 6/2008 | Cho et al. |
| 2008/0130788 A1 | 6/2008 | Copeland |
| 2008/0144709 A1 | 6/2008 | McCallister et al. |
| 2008/0159377 A1 | 7/2008 | Allpress et al. |
| 2008/0207143 A1 | 8/2008 | Skarby et al. |
| 2008/0260985 A1 | 10/2008 | Shirai et al. |
| 2009/0003425 A1 | 1/2009 | Shen et al. |
| 2009/0028234 A1 | 1/2009 | Zhu |
| 2009/0034625 A1 | 2/2009 | Komi et al. |
| 2009/0052577 A1 | 2/2009 | Wang |
| 2009/0058521 A1 | 3/2009 | Fernandez |
| 2009/0075590 A1 | 3/2009 | Sahinoglu et al. |
| 2009/0086808 A1 | 4/2009 | Liu et al. |
| 2009/0115513 A1 | 5/2009 | Hongo et al. |
| 2009/0122854 A1 | 5/2009 | Zhu et al. |
| 2009/0137212 A1 | 5/2009 | Belotserkovsky |
| 2009/0185612 A1 | 7/2009 | McKown |
| 2009/0213907 A1 | 8/2009 | Bottomley |
| 2009/0213908 A1 | 8/2009 | Bottomley |
| 2009/0220034 A1 | 9/2009 | Ramprashad et al. |
| 2009/0245226 A1 | 10/2009 | Robinson et al. |
| 2009/0245401 A1 | 10/2009 | Chrabieh et al. |
| 2009/0286494 A1 | 11/2009 | Lee et al. |
| 2009/0290620 A1 | 11/2009 | Tzannes et al. |
| 2009/0323841 A1 | 12/2009 | Clerckx et al. |
| 2010/0002692 A1 | 1/2010 | Bims |
| 2010/0034253 A1 | 2/2010 | Cohen |
| 2010/0039100 A1 | 2/2010 | Sun et al. |
| 2010/0062705 A1 | 3/2010 | Rajkotia et al. |
| 2010/0074349 A1 | 3/2010 | Hyllander et al. |
| 2010/0158085 A1 | 6/2010 | Khayrallah |
| 2010/0166050 A1 | 7/2010 | Aue |
| 2010/0172309 A1 | 7/2010 | Forenza et al. |
| 2010/0202505 A1 | 8/2010 | Yu et al. |
| 2010/0202507 A1 | 8/2010 | Allpress et al. |
| 2010/0203854 A1 | 8/2010 | Yu et al. |
| 2010/0208774 A1 | 8/2010 | Guess et al. |
| 2010/0208832 A1 | 8/2010 | Lee et al. |
| 2010/0215107 A1 | 8/2010 | Yang |
| 2010/0220825 A1 | 9/2010 | Dubuc et al. |
| 2010/0278288 A1 | 11/2010 | Panicker et al. |
| 2010/0283540 A1 | 11/2010 | Davies |
| 2010/0284481 A1 | 11/2010 | Murakami et al. |
| 2010/0309796 A1 | 12/2010 | Khayrallah |
| 2010/0329325 A1 | 12/2010 | Mobin et al. |
| 2011/0051864 A1 | 3/2011 | Chalia et al. |
| 2011/0064171 A1 | 3/2011 | Huang et al. |
| 2011/0069791 A1 | 3/2011 | He |
| 2011/0074500 A1 | 3/2011 | Bouillet et al. |
| 2011/0074506 A1 | 3/2011 | Kleider et al. |
| 2011/0075745 A1 | 3/2011 | Kleider et al. |
| 2011/0090986 A1 | 4/2011 | Kwon et al. |
| 2011/0101957 A1 | 5/2011 | Boufounos |
| 2011/0134899 A1 | 6/2011 | Jones, IV et al. |
| 2011/0150064 A1 | 6/2011 | Kim et al. |
| 2011/0164492 A1 | 7/2011 | Ma et al. |
| 2011/0170630 A1 | 7/2011 | Silverman et al. |
| 2011/0175678 A1 | 7/2011 | Velazquez |
| 2011/0182329 A1 | 7/2011 | Wehinger |
| 2011/0188550 A1 | 8/2011 | Wajcer et al. |
| 2011/0228869 A1 | 9/2011 | Barsoum et al. |
| 2011/0243266 A1 | 10/2011 | Roh |
| 2011/0249709 A1 | 10/2011 | Shiue et al. |
| 2011/0275338 A1 | 11/2011 | Seshadri et al. |
| 2011/0310823 A1 | 12/2011 | Nam et al. |
| 2011/0310978 A1 | 12/2011 | Wu et al. |
| 2012/0025909 A1 | 2/2012 | Jo et al. |
| 2012/0027132 A1 | 2/2012 | Rouquette |
| 2012/0051464 A1 | 3/2012 | Kamuf et al. |
| 2012/0106617 A1 | 5/2012 | Jao et al. |
| 2012/0120990 A1 | 5/2012 | Koren et al. |
| 2012/0163489 A1 | 6/2012 | Ramakrishnan |
| 2012/0177138 A1 | 7/2012 | Chrabieh et al. |
| 2012/0195392 A1* | 8/2012 | Kushnir ............ H04L 25/03343 375/296 |
| 2012/0207248 A1 | 8/2012 | Ahmed et al. |
| 2012/0269286 A1 | 10/2012 | Huang et al. |
| 2013/0028299 A1 | 1/2013 | Tsai |
| 2013/0044877 A1 | 2/2013 | Liu et al. |
| 2013/0077563 A1 | 3/2013 | Kim et al. |
| 2013/0121257 A1 | 5/2013 | He et al. |
| 2013/0200950 A1 | 8/2013 | Bai |
| 2013/0343480 A1 | 12/2013 | Eliaz |
| 2013/0343487 A1 | 12/2013 | Eliaz |
| 2014/0036969 A1 | 2/2014 | Wyville et al. |
| 2014/0036986 A1 | 2/2014 | Eliaz |
| 2014/0056387 A1 | 2/2014 | Asahina |
| 2014/0098841 A2 | 4/2014 | Song et al. |
| 2014/0098907 A1 | 4/2014 | Eliaz |
| 2014/0098915 A1 | 4/2014 | Eliaz |
| 2014/0105267 A1 | 4/2014 | Eliaz |
| 2014/0105268 A1 | 4/2014 | Eliaz |
| 2014/0105332 A1 | 4/2014 | Eliaz |
| 2014/0105334 A1 | 4/2014 | Eliaz |
| 2014/0108892 A1 | 4/2014 | Eliaz |
| 2014/0133540 A1 | 5/2014 | Eliaz |
| 2014/0140388 A1 | 5/2014 | Eliaz |
| 2014/0140446 A1 | 5/2014 | Eliaz |
| 2014/0146911 A1 | 5/2014 | Eliaz |
| 2014/0161158 A1 | 6/2014 | Eliaz |
| 2014/0161170 A1 | 6/2014 | Eliaz |
| 2014/0198255 A1 | 7/2014 | Kegasawa |
| 2014/0241477 A1 | 8/2014 | Eliaz |
| 2014/0247715 A1 | 9/2014 | Tsai et al. |
| 2014/0247904 A1 | 9/2014 | Eliaz |
| 2014/0269861 A1 | 9/2014 | Eliaz |

(56) References Cited

U.S. PATENT DOCUMENTS

| | | |
|---|---|---|
| 2014/0286459 A1 | 9/2014 | Eliaz |
| 2014/0294119 A1 | 10/2014 | Sochacki |
| 2014/0301507 A1 | 10/2014 | Eliaz |
| 2014/0321525 A1 | 10/2014 | Eliaz |
| 2014/0328428 A1 | 11/2014 | Eliaz |
| 2014/0355718 A1 | 12/2014 | Guan et al. |
| 2014/0376358 A1 | 12/2014 | Eder et al. |
| 2015/0010108 A1 | 1/2015 | Eliaz |
| 2015/0049843 A1 | 2/2015 | Reuven et al. |
| 2015/0055722 A1 | 2/2015 | Eliaz |
| 2015/0063499 A1 | 3/2015 | Eliaz |
| 2015/0070089 A1 | 3/2015 | Eliaz |
| 2015/0071389 A1 | 3/2015 | Eliaz |
| 2015/0078491 A1 | 3/2015 | Eliaz |
| 2015/0124912 A1 | 5/2015 | Eliaz |
| 2015/0131709 A1 | 5/2015 | Eliaz |
| 2015/0131710 A1 | 5/2015 | Eliaz |
| 2015/0131759 A1 | 5/2015 | Eliaz et al. |
| 2015/0156041 A1 | 6/2015 | Eliaz |
| 2015/0172078 A1 | 6/2015 | Eliaz |
| 2015/0172079 A1 | 6/2015 | Eliaz |
| 2015/0207527 A1 | 7/2015 | Eliaz et al. |
| 2015/0222456 A1 | 8/2015 | Intrater et al. |
| 2015/0256293 A1 | 9/2015 | Eliaz et al. |
| 2015/0270926 A1 | 9/2015 | Eliaz |
| 2015/0312065 A1 | 10/2015 | Eliaz |

FOREIGN PATENT DOCUMENTS

| | | | |
|---|---|---|---|
| CN | 101582748 A | | 11/2009 |
| EP | 1865677 A1 | | 12/2007 |
| EP | 1928141 A2 | | 4/2008 |
| EP | 1953981 A1 | | 8/2008 |
| WO | 99/41839 A1 | | 8/1999 |
| WO | 2007/000495 A1 | | 1/2007 |
| WO | 2008/154965 A1 | | 12/2008 |
| WO | 2012/092647 A1 | | 7/2012 |
| WO | 2013/030815 A1 | | 3/2013 |

OTHER PUBLICATIONS

Modulation and Coding for Linear Gaussian Channels, G. David Forney, Jr., and Gottfried Ungerboeck, IEEE Transactions of Information Theory, vol. 44, No. 6, Oct. 1998 pp. 2384-2415 (32 pages).

Intuitive Guide to Principles of Communications, www.complextoreal.com, Inter Symbol Interference (ISI) and Root-raised Cosine (RRC) filtering, (2002), pp. 1-23 (23 pages).

Chan, N., "Partial Response Signaling with a Maximum Likelihood Sequence Estimation Receiver" (1980). Open Access Dissertations and Theses. Paper 2855, (123 pages).

The Viterbi Algorithm, Ryan, M.S. and Nudd, G.R., Department of Computer Science, Univ. of Warwick, Coventry, (1993) (17 pages).

R. A. Gibby and J. W. Smith, "Some extensions of Nyquist's telegraph transmission theory," Bell Syst. Tech. J., vol. 44, pp. 1487-1510, Sep. 1965.

J. E. Mazo and H. J. Landau, "On the minimum distance problem for faster-than-Nyquist signaling," IEEE Trans. Inform. Theory, vol. 34, pp. 1420-1427, Nov. 1988.

D. Hajela, "On computing the minimum distance for faster than Nyquist signaling," IEEE Trans. Inform. Theory, vol. 36, pp. 289-295, Mar. 1990.

G. Ungerboeck, "Adaptive maximum-likelihood receiver for carrier modulated data-transmission systems," IEEE Trans. Commun., vol. 22, No. 5, pp. 624-636, May 1974.

G. D. Forney, Jr., "Maximum-likelihood sequence estimation of digital sequences in the presence of intersymbol interference," IEEE Trans. Inform. Theory, vol. 18, No. 2, pp. 363-378, May 1972.

A. Duel-Hallen and C. Heegard, "Delayed decision-feedback sequence estimation," IEEE Trans. Commun., vol. 37, pp. 428-436, May 1989.

M. V. Eyubog •Iu and S. U. Qureshi, "Reduced-state sequence estimation with set partitioning and decision feedback," IEEE Trans. Commun., vol. 36, pp. 13-20, Jan. 1988.

W. H. Gerstacker, F. Obernosterer, R. Meyer, and J. B. Huber, "An efficient method for prefilter computation for reduced-state equalization," Proc. of the 11th IEEE Int. Symp. Personal, Indoor and Mobile Radio Commun. PIMRC, vol. 1, pp. 604-609, London, UK, Sep. 18-21, 2000.

W. H. Gerstacker, F. Obernosterer, R. Meyer, and J. B. Huber, "On prefilter computation for reduced-state equalization," IEEE Trans. Wireless Commun., vol. 1, No. 4, pp. 793-800, Oct. 2002.

Joachim Hagenauer and Peter Hoeher, "A Viterbi algorithm with soft-decision outputs and its applications," in Proc. IEEE Global Telecommunications Conference 1989, Dallas, Texas, pp. 1680-1686, Nov. 1989.

S. Mita, M. Izumita, N. Doi, and Y. Eto, "Automatic equalizer for digital magnetic recording systems" IEEE Trans. Magn., vol. 25, pp. 3672-3674, 1987.

E. Biglieri, E. Chiaberto, G. P. Maccone, and E. Viterbo, "Compensation of nonlinearities in high-density magnetic recording channels," IEEE Trans. Magn., vol. 30, pp. 5079-5086, Nov. 1994.

W. E. Ryan and A. Gutierrez, "Performance of adaptive Volterra equalizers on nonlinear magnetic recording channels," IEEE Trans. Magn., vol. 31, pp. 3054-3056, Nov. 1995.

X. Che, "Nonlinearity measurements and write precompensation studies for a PRML recording channel," IEEE Trans. Magn., vol. 31, pp. 3021-3026, Nov. 1995.

O. E. Agazzi and N. Sheshadri, "On the use of tentative decisions to cancel intersymbol interference and nonlinear distortion (with application to magnetic recording channels)," IEEE Trans. Inform. Theory, vol. 43, pp. 394-408, Mar. 1997.

Miao, George J., Signal Processing for Digital Communications, 2006, Artech House, pp. 375-377.

Xiong, Fuqin. Digital Modulation Techniques, Artech House, 2006, Chapter 9, pp. 447-483.

Faulkner, Michael, "Low-Complex ICI Cancellation for Improving Doppler Performance in OFDM Systems", Center for Telecommunication and Microelectronics, 1-4244-0063-5/06/$2000 (c) 2006 IEEE. (5 pgs).

Stefano Tomasin, et al. "Iterative Interference Cancellation and Channel Estimation for Mobile OFDM", IEEE Transactions on Wireless Communications, vol. 4, No. 1, Jan. 2005, pp. 238-245.

Int'l Search Report and Written Opinion for PCT/IB2013/01866 dated Mar. 21, 2014.

Int'l Search Report and Written Opinion for PCT/IB2013/001923 dated Mar. 21, 2014.

Int'l Search Report and Written Opinion for PCT/IB2013/001878 dated Mar. 21, 2014.

Int'l Search Report and Written Opinion for PCT/IB2013/002383 dated Mar. 21, 2014.

Int'l Search Report and Written Opinion for PCT/IB2013/01860 dated Mar. 21, 2014.

Int'l Search Report and Written Opinion for PCT/IB2013/01970 dated Mar. 27, 2014.

Int'l Search Report and Written Opinion for PCT/IB2013/01930 dated May 15, 2014.

Int'l Search Report and Written Opinion for PCT/IB2013/02081 dated May 22, 2014.

Al-Dhahir, Naofal et al., "MMSE Decision-Feedback Equalizers: Finite-Length Results" IEEE Transactions on Information Theory, vol. 41, No. 4, Jul. 1995.

Cioffi, John M. et al., "MMSE Decision-Feedback Equalizers and Coding—Park I: Equalization Results" IEEE Transactions on Communications, vol. 43, No. 10, Oct. 1995.

Eyuboglu, M. Vedat et al., "Reduced-State Sequence Estimation with Set Partitioning and Decision Feedback" IEEE Transactions onCommunications, vol. 36, No. 1, Jan. 1988.

Khaled M. Gharaibeh, Nonlinear Distortion in Wireless Systems, 2011, John Wiley & Sons, 2nd Edition, chapter 3, pp. 59-81.

Forney, G. David Jr., "Coset Codes—Part I: Introduction and Geometrical Classification" IEEE Transactions on Information Theory, vol. 34, No. 5, Sep. 1988.

Int'l Search Report and Written Opinion for PCT/IB2014/002449 dated Mar. 12, 2015.

(56) References Cited

OTHER PUBLICATIONS

Digital predistortion of power amplifiers for wireless applications (Doctoral dissertation, Georgia Institute of Technology). Retrieved from the internet <http://http://202.28.199.34/multim/3126235.pdf> Ding, L. Mar. 31, 2005.

Digital predistortion for power amplifiers using separable functions. Signal Processing, IEEE Transactions on, 58(8), 4121-4130. Retrieved from the internet </http://arxiv.org/ftp/arxiv/papers/1306/1306.0037.pdf> Jiang, H., & Wilford, P.A. Aug. 8, 2010.

Digital predistortion linearization methods for RF power amplifiers. Teknillinen korkeakoulu. Retrieved from the Internet <http://lib.tkk.fi/Diss/2008/isbn9789512295463/isbn9789512295463.pdf> Teikari I. Sep. 30, 2008.

Kayhan, F., et al., Joint Signal-Labeling Optimization for Pragmatic Capacity under Peak-Power Constraint, 978-1-4244-5637, 2010.

Kayhan, F., et al., Constellation Design for Transmission over Nonlinear Satellite Channels, Oct. 5, 2012.

Liu, N. et al., Iterative intersymbol interference cancellation in vestigial sideband Nyquist-subcarrier modulation system. Nov. 2014, Optical Engineering, vol. 53(11) 116109.

Singla, R., et al. Digital predistortion of power amplifiers using look-up table method with memory effects for LTE wireless systems, Journ. On Wireless Communications and Networking 2012:330 http:jwcn.eurasipjournals.com/content/2012/1/330.

Tellado, J. et al., PAR Reduction in Multicarrier Transmission Systems, Feb. 9, 1998.

Prlja, Adnan et al., "Receivers for Faster-than-Nyquist Signaling with and Without Turbo Equalization," Jul. 6, 2008.

Kayhan, F., et al., "Signal and Labeling Optimization for Non-Linear and Phase Noise Channels," Department of Electronics and Telecommunications, Dec. 3, 2012.

Han, H., et al. "Simultaneous Predistortio and nonlinear Detection for nonlinearly Distorted OFDM Signals," 2005.

Int'l Search Report and Written Opinion for PCT/IB2014/002688 dated Jun. 29, 2015.

Gregorio, F. H., et al. Receiver-side nonlinearities mitigation using an extended interative decision-based tecnique. Signal Processing, 91(8), 2042-2056, Mar. 23, 2011.

Int'l Search Report and Written Opinion for PCT/IB2015/00572 dated Oct. 10, 2015.

Chen, H., et al. An Iterative Method to Restore the Performance of Clipped and Filtered OFDM Signals, Dept. Elec. & Comp. Eng. 0-7803-7802-4/03/© 2003 IEEE, pp. 3438-3443.

Aziz, W., et al. PAPR Reduction in OFDM using Clipping and Filtering, World Applied Sciences Journal 18(11): pp. 1495-1500, 2012 ISSN 1818-4952 © IDOSI Publications, 2012.

Abouty, S., et al. A Novel Iterative Clipping and Filtering Technique for PAPR Reduction of OFDM Signals: System Using DCT/IDCT Transform, Int'l Jour. of Future Generation Comm. and Networking, vol. 6, No. 1, Feb. 2013, pp. 1-8.

Gurung, A.K., et al., Power Savings Analysis of Clipping and Filtering Method in OFDM Systems, 978-1-4244-2603-4/08/© 2008 IEEE, pp. 204-208.

Wang, Y.-C., et al. Optimized Iterative Clipping and Filtering for PAPR Reduction of OFDM Signals, Jan. 13, 2011, pp. 1-9.

Lee, T., et al. Experimental Analysis of Clipping and Filtering Effects on OFDM Systems, 978-1-4244-6404-3/10/© 2010 IEEE, pp. 1-5.

da Silva, Pedro F.G., et al. Design of Crest Factor Reduction Techniques Based on Clipping and Filtering for Wireless Communications Systems, 978-1-4799-1132-5/13/© 2013 IEEE, pp. 1-5.

Rana, M. M., Clipping Based PAPR Reduction Method for LTE OFDMA Systems, Int'l Journ. of Elec. & Comp. Sci. IJECS-IJENS vol. 10 No. 05 (Oct. 2010) pp. 1-5.

McClearnon, D., et al., Wideband Digital Pre-Distortion Modeling for LTE-Advanced, Agilent Technologies, Jul. 2012, p. 64.

* cited by examiner

TRANSMITTER SIGNAL SHAPING

PRIORITY CLAIM

This application claims priority to the following application(s), each of which is hereby incorporated herein by reference:
U.S. provisional patent application 62/042,356 filed on Aug. 27, 2014; and
U.S. provisional patent application 62/126,881 filed on Mar. 2, 2015.

BACKGROUND

Limitations and disadvantages of conventional and traditional approaches to electronic communications will become apparent to one of skill in the art, through comparison of such systems with some aspects of the present invention as set forth in the remainder of the present application with reference to the drawings.

BRIEF SUMMARY

Systems and methods are provided for transmitter signal shaping, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION

Conventional receivers can manage relatively low amounts of nonlinear distortion of their input communication signal. In contrast, receivers in accordance with various implementations of this disclosure may be capable of handling deep communication signal distortion by measuring and modeling the nonlinear response. This capability allows communication systems to handle deep Power Amplifier (PA) nonlinearity. This capability can also be used to handle intentional distortion digitally applied by the transmitter in order to improve various signal characteristics. Circuitry for introducing such digital distortion is referred to herein as a TX nonlinear shaper. In various implementations, the TX nonlinear shaper can achieve one or more the following goals:

Reduce signal peak to average power ratio, which has many uses. One use applicable to working with deep PA distortion and unraveling it at the receiver using PA model is preventing the signal from getting too close to the power rails. An advantage of this is that PA modeling near the power rails may be difficult (e.g., costly in terms of time, memory, processing power, etc.).

Reduce signal cubic metric (a metric defined by 3GPP) in order to reduce transmitted signal out-of-band distortion (i.e. to reduce occurrence of exceeding allowed out-of-band spectral emission mask or Adjacent Channel Leakage Ratio), while working relatively close to PA compression.

Allowing to work at lower PA output backoff for a particular level of receiver performance Trading off, at the receiver, noise enhancement due to a distortion cancellation process in the receiver, vs Minimizing received signal clips due PA signal exceeding PA rails.

Optimizing distortion function for operation with a receiver that is capable of handling nonlinear distortion. Where the optimizing may, for example, be in the sense of maximum coded signal transmission performance.

The composite response of the TX nonlinear shaper and the PA is referred to in this disclosure as the composite nonlinear response. This composite nonlinear response may include memory. As compared to Digital Pre-distortion (DPD) techniques which attempts to substantially linearize the PA response, thus producing a linearized composite response (typically referred to as "soft limiter"), the TX nonlinear shaper of various implementations of this disclosure aims for a nonlinear composite response that is soft (well behaved derivative) and monotonic, and allows substantially better receiver performance (for a receiver that can manage distorted signal) than the linearized composite achieved with conventional DPD.

Figure 1:
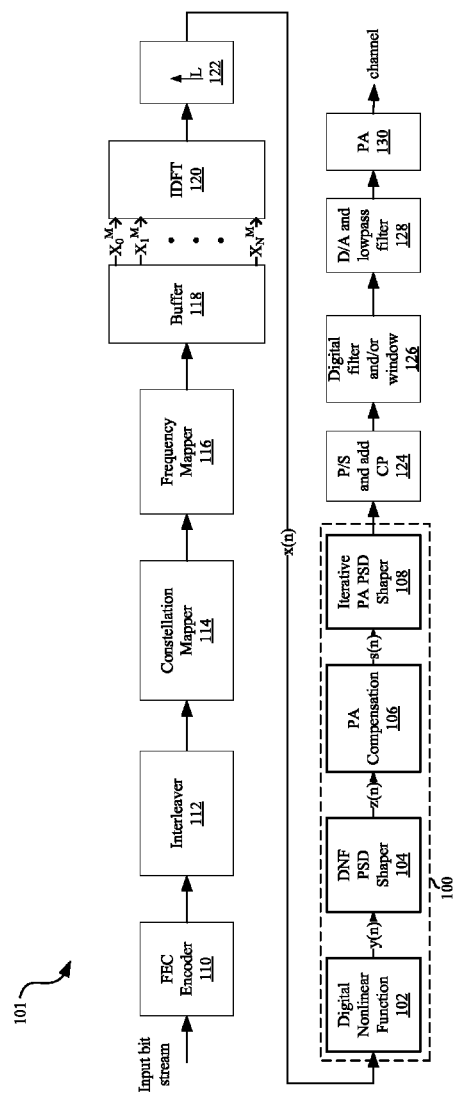
FIG. 1 is a diagram illustrating an example transmitter with TX nonlinear shaping circuit.
Figure 2:
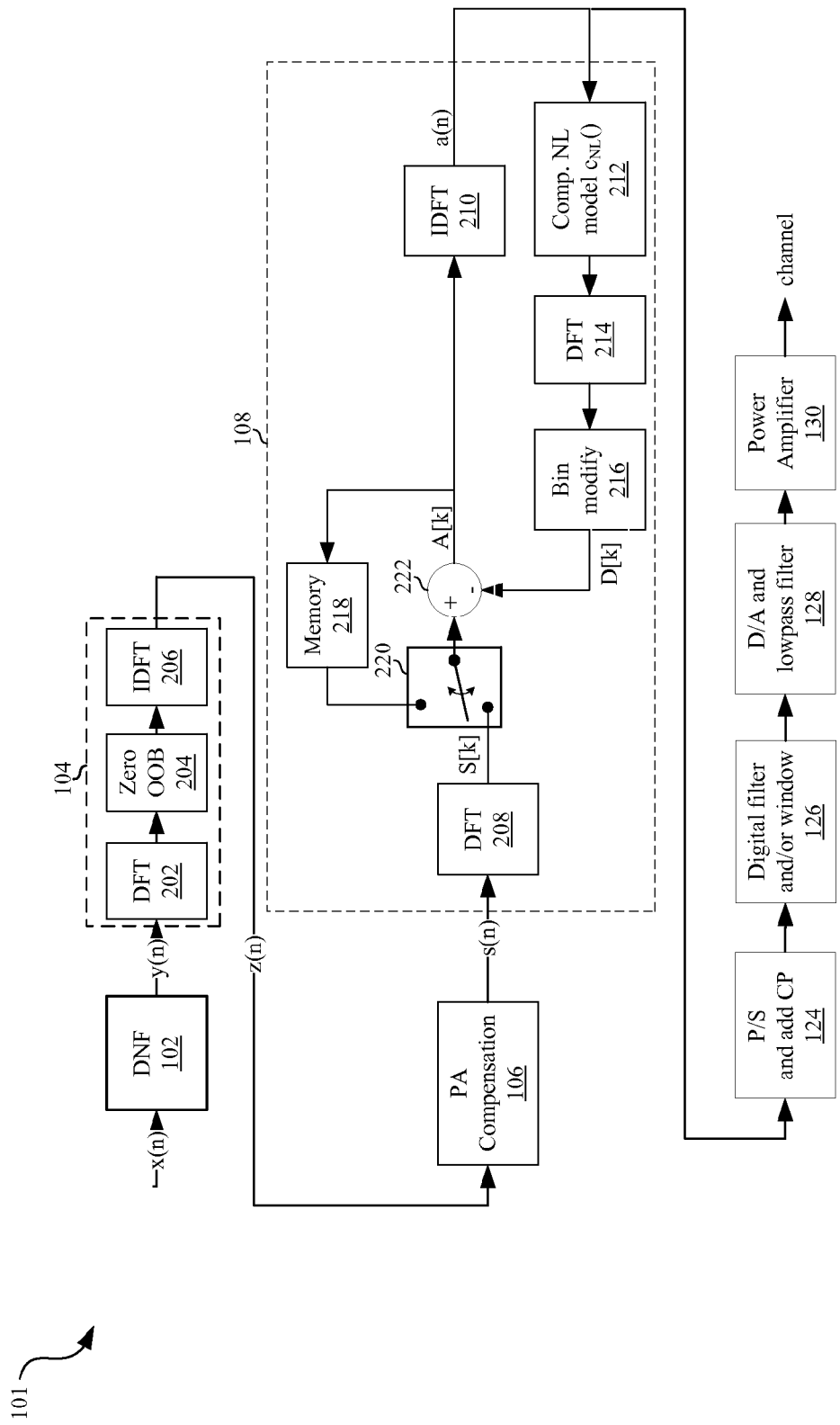
FIG. 2 is a diagram illustrating additional details of an example transmitter with Tx nonlinear shaping circuit.

Referring now to FIGS. 1 and 2, in an example implementation, the uplink (UL) transmitter (e.g., of each of multiple mobile units) have the general block diagram shown in FIGS. 1 and 2. It is understood that the same principles described by this disclosure can be applied in other orthogonal frequency division multiplexed (OFDM) or frequency division multiple access (FDMA) systems such as orthogonal frequency division multiple access (OFDMA), and single carrier FDMA (LTE ScFDMA). The example transmitter 101 comprising forward error correction (FEC) encoding circuit 110, interleaving circuit 112, constellation mapping circuit 114, bin mapping circuitry 116, buffer 118, inverse discrete Fourier transform (IDFT) circuit 120, upsampler 122, Tx nonlinear shaper circuit 100, parallel to serial conversion (P/S) and cyclic prefix (CP) insertion circuit 124, digital filtering and/or windowing circuitry 128, digital-to-analog conversion (DAC) and lowpass filter circuit 128, and power amplifier (PA) circuit 130.

The FEC encoding circuit 110 is operable to encode an incoming bitstream in accordance with any suitable FEC encoding algorithm such as Reed-Solomon encoding, low density parity check (LDPC) encoding, turbo encoding, and/or the like to output FEC codewords.

The interleaving circuit 112 is operable to interleave the FEC symbols/bits output by FEC encoding circuit 110 such that the order in which the FEC symbols/bits emerge from the interleaving circuit 112 is different than the order in which they emerge from the FEC encoding circuit 110.

The constellation mapping circuit 114 is operable to map bits of the FEC codewords to symbols of a selected constellation (e.g., BPSK, QPSK, N-QAM, or the like).

The bin mapping circuitry 116 is operable to assign each of the frequency-domain symbols output by the constellation mapping circuit 114 to a respective one of a plurality of frequency bins. The frequency mapping may, for example, be based on frequency bins assigned to the transmitter 101 by a link partner. For example, where the transmitter 101 is in a LTE handset, the frequencies may be assigned by the base station currently handling the handset. The output of the bin mapping circuitry 116 may be zero padded relative to its input.

The buffer 118 is operable to store the frequency-mapped symbols until an OFDM symbol's worth of constellation symbols (e.g., an integer number F) are buffered, at which point the constellation symbols are passed to the IDFT circuit 120.

The IDFT circuit 120 converts the frequency-domain representation of the constellation symbols to a time-domain representation (e.g., comprising T time-domain samples).

The upsampler 122 is operable to upsample the time-domain representation by a factor of L (e.g., resulting if L×T samples from the original T samples).

The P/S and CP add circuit 124 is operable to convert the parallel stream of time-domain samples to a serial stream and then adds a cyclic prefix.

The digital filtering and/or windowing circuit 126 is operable to apply a windowing function and/or other filtering to the output of circuit 124, resulting in a digital-domain OFDM symbol.

The DAC and lowpass filtering circuit is operable to filter and convert to analog the digital-domain OFDM symbol output by circuit 126, resulting in an analog-domain OFDM symbol.

The power amplifier (PA) 130 is operable to transmit the OFDM symbol onto a wired, wireless, or optical communication medium.

In the example implementation shown in FIGS. 1 and 2, the Tx nonlinear shaper circuit 100 comprises digital nonlinear function (DNF) circuit 102, DNF power spectral density (PSD) shaper 104, PA compensation circuit 106, and iterative PA PSD shaper circuit 108. Each of these circuits is described in further detail below.

In the example transmitter of FIGS. 1 and 2, the input bit stream is encoded by FEC encoder 110, interleaved by interleaver 112, mapped to symbols according to a selected constellations (i.e. QAM mapping) by mapping constellation mapping circuit 114, and then mapped in frequency by frequency mapping circuit 116 to subcarriers allocated to the transmitter 101. These subcarriers are typically allocated by the base station, and may or may not be continuous in frequency. Inverse discrete Fourier transform (IDFT) circuit 120 operates to transform the signal from frequency domain to time domain and the signal is then interpolated by interpolator 122. The resulting oversampled signal x(n) is then passed through the digital nonlinear function (DNF) circuit 102, in order to reduce its PAPR and/or Cubic Metric and improve nonlinear receiver performance. The resulting digitally compressed signal y(n) is fed to the DNF PSD shaper 104 that substantially cancels the out-of-band re-growth due to distortion introduced by DNF circuit 102. The signal z(n) output by PSD shaper circuit 104 is processed by PA compensation circuit 106 which uses a gross model of the PA 130 to approximately compensate for the nonlinearity of the PA 130. The effect of the PA compensation circuitry may be a composite response of the PA compensation circuit 106 and PA 130 that is a soft limiter (i.e., exhibits a clipped linear response). This composite may not need to be an accurate soft limiter, since it just serves to transform the composite response of the DNF 102, the PA compensation circuit 106, and the power amplifier (PA) such that it approximates the nonlinear response targeted by the DNF circuit 102. Therefore the PA compensation circuit 106 can be far less accurate than conventional digital pre-distortion (DPD) functions. The PA compensated signal s(n) is fed to the iterative PA PSD shaper 108, which may operate, when an accurate model of the PA 130 is known, to cancel out the out-of-band distortion produced by the PA 130. A cyclic prefix (CP) is then added by circuit 124 to the output of the iterative PA shaper 108, and windowing may be applied by circuit 126. The resulting signal is DAC converted and filtered by circuit 128, up-converted and amplified by the PA 130.

I. DNF Circuit 102

The DNF circuit 102 may be optimized to compress the transmitted signal to limit out-of-band distortion introduced by the Power Amplifier (e.g. reducing cubic metric) and maximize receiver performance. In various example implementations, the DNF circuit 102 results in a smooth and monotonic nonlinearity designed to allow operation under deep compression at the Power Amplifier 130 without violating transmission mask and still allowing for sufficient receiver performance. A few example Approaches to configuring the DNF circuit 102 will now be discussed. It will be understood, however, that many design approaches are possible and fall within the scope of this disclosure.

The following is notation used in this disclosure.
1. x(n)—Original transmission signal
2. y(n)—Distorted signal
3. $g_{NL}$—Digital Nonlinear function (DNF)
4. $f_{NL}$—PA nonlinearity
5. $c_{NL}$—Composite nonlinearity
6. $x_{sat}$—Lowest x value that is saturated by none linearity, i.e. $c_{NL}(x)=c_{NL}(x_{SAT})=A_{SAT}$ for any $|x| \geq x_{SAT}$
7. $h_{NL}$—inverse function
8. $A_{SAT}$—the maximum PA output signal.
9. CM—Is the desired cubic metric of the transmission signal.
10. $B_{PA\_O}$—The PA Output Backoff
11. $\sigma_x$—RMS of input OFDM signal to DNF
12. $v \propto, \sigma_n$—Receiver input noise and its standard deviation of receiver input noise
13. $v, \sigma_v$—Nonlinear-Solver Receiver output noise and its standard deviation of receiver enhanced noise due to receiver distortion cancellation
14. $\sigma_{vd}$—Standard deviation of total distortion and noise at output of distortion cancelling receiver A. Example 1

In a first example implementation, the DNF 102 aims to minimize the average total noise and clip distortion experienced by the receiver in the process of cancelling out the distortion. In such an implementation, the DNF 102 approximately models distortion cancellation at the receiver as an inversion of the composite $c_{NL}$. In other words, the received distorted signal is $$y[n]=c_{NL}(x_{[n]})$$

Thus, the inverting function is denoted $h_{NL}(y)$ such that $$h_{NL}(y_{[n]})=h_{NL}(c_{NL}(x_{[n]})+v_{[n]}') \cong x_{[n]}$$

Based on AM/AM and AM/PM distortion curves for the inversion of the composite $c_{NL}$, the amplitude of the received samples can be used, i.e.

$$h_{NL}(y[n])=h_{amp}(|y[n]|) \cdot h_{phase}(|y[n]|) \cdot \exp(j \cdot \arg(y))$$

where $h_{amp}$ and $h_{phase}$ compute the correct amplitude and phase correction.

The inversion, however, is noisy and biased, two impairments may be desirable to minimize $$h_{NL}(y_{[n]}) = h_{NL}(c_{NL}(x_{[n]}) + v'_{[n]}) = x_{[n]} + v_{[n]} + b_{[n]}$$

where $b_{[n]}$ is the bias occurring when $|x_{[n]}| > X_{SAT}$, since in this case $y_{[n]}$ cannot be inverted since $x_{[n]}$ is saturated by $c_{NL}(x)$.

To estimate the noise enhancement, the basic identity $$h'(c_{NL}(x)) = \frac{1}{c'_{NL}(x)}$$

can be used, which can be easily derived by differentiating $h(c_{NL}(x)) = x$. Where $f'(\ )$ denotes the derivative of function $f(\ )$.

Thus the total noise+distortion due to clipping is $$\sigma_{vd}^2 = \frac{1}{\sigma_x^2} \int_0^{x_{SAT}} x \cdot \exp\left(-\frac{x^2}{\sigma_x^2}\right) \cdot \frac{\sigma_n^2}{(c'_{NL}(x))^2} dx +$$

$$\frac{2}{\sigma_x^2} \int_{x_{SAT}}^{\infty} x \cdot \exp\left(-\frac{x^2}{\sigma_x^2}\right)(x - x_{SAT})^2 dx$$

Since the inversion is based on the received signal amplitude, and the OFDM signal is complex Gaussian, the underlying distribution determining the noise enhancement is Rayleigh (with corresponding complex Gaussian signal power of $\sigma_X^2$).

An example process for configuring the DNF circuit 102 for minimizing average total noise and distortion is as follows:

Using Lagrange multipliers it can be shown that a good choice for the composite function $c_{NL}(x)$ would be such that:

$$c'_{NL}(x)^3 = K \cdot x \cdot \exp\left(-\frac{x^2}{2 \cdot \sigma_x^2}\right)$$

for $x < X'_{SAT}$

And to bound $|c_{NL}(x)| \le A_{SAT}$ K is determined such that $$A_{SAT} = \int_0^{X'_{SAT}} c'_{NL}(x) dx$$

The parameter $X'_{SAT}$ may be optimized numerically by searching for the $X'_{SAT}$ that minimizes $\sigma_{vd}^2(X'_{SAT})$.

B. Example 2

In another example implementation using a more heuristic criteria, the DNF circuit 102 is used in order transform the complex Gaussian distribution of $x_{[n]}$ at the input of the DNF circuit 102 to another distribution having preferred characteristics at the output of the PA 130. For example, the output distribution may be configured to maximize capacity (or achieve a desired minimum threshold capacity) for the particular power backoff at which the PA 130 is operating. For example, for very low PA output backoff of 3 dB and high signal-to-noise ratio (SNR) at the receiver, the system could transform the input distribution such that the distribution at the output of PA 130 is uniform within a circle of a radii $A_{SAT}$.

This maximizes the entropy of the power-limited transmitted signal, which approximately maximizes capacity in the assumed high SNR case.

The distribution of $y = C_{NL}(x)$ when x is complex Gaussian in again influenced by the derivative $c'_{NL}(x)$. Using the basic identity $p_y(y) = p_x(c_{NL}^{-1}(y))/c'_{NL}(c_{NL}^{-1}(y))$, then to get a uniform distribution the following is needed:

$$1 = p_y(y) = \frac{1}{\pi \sigma_x^2} \exp\left(-\frac{c_{NL}^{-1}(y)^2}{\sigma_x^2}\right) \frac{1}{c'_{NL}(c_{NL}^{-1}(y))}$$

Thus to output a uniform distribution the derivative $c'_{NL}(x)$ is set as follows:

$$c'_{NL}(x) = K \cdot \exp\left(-\frac{c_{NL}^{-1}(y)^2}{\sigma_x^2}\right)$$

and to bound $|c_{NL}(x)| \le A_{SAT}$ it is also needed to determine K such that $$A_{SAT} = \int_0^{X'_{SAT}} c'_{NL}(x) dx$$

As before, the system can select $X_{SAT}'$ to minimize the overall clip distortion, or optimize it based on receiver performance.

C. Example 3

The approaches in examples 1 and 2 above have a general form of $c_{NL}'(x) = K \cdot pdf(x)$, where the probability density function (pdf(x)) is the underlying Rayleigh or complex Gaussian probability density function. These approaches can be generalized to:

$$c_{NL}'(x) = K \cdot pdf(x)^\alpha$$

where $\alpha$ is a real positive value, pdf(x) is some probability density function, and K is chosen such that $$A_{SAT} = \int_0^{X'_{SAT}} c'_{NL}(x) dx$$

This family of DNF functions contains example 2 (above) when pdf(x) is Gaussian and $\alpha = 1$. Empirically, the whole set of functions gives a good tradeoff between noise enhancement and backoff.

Figure 4:
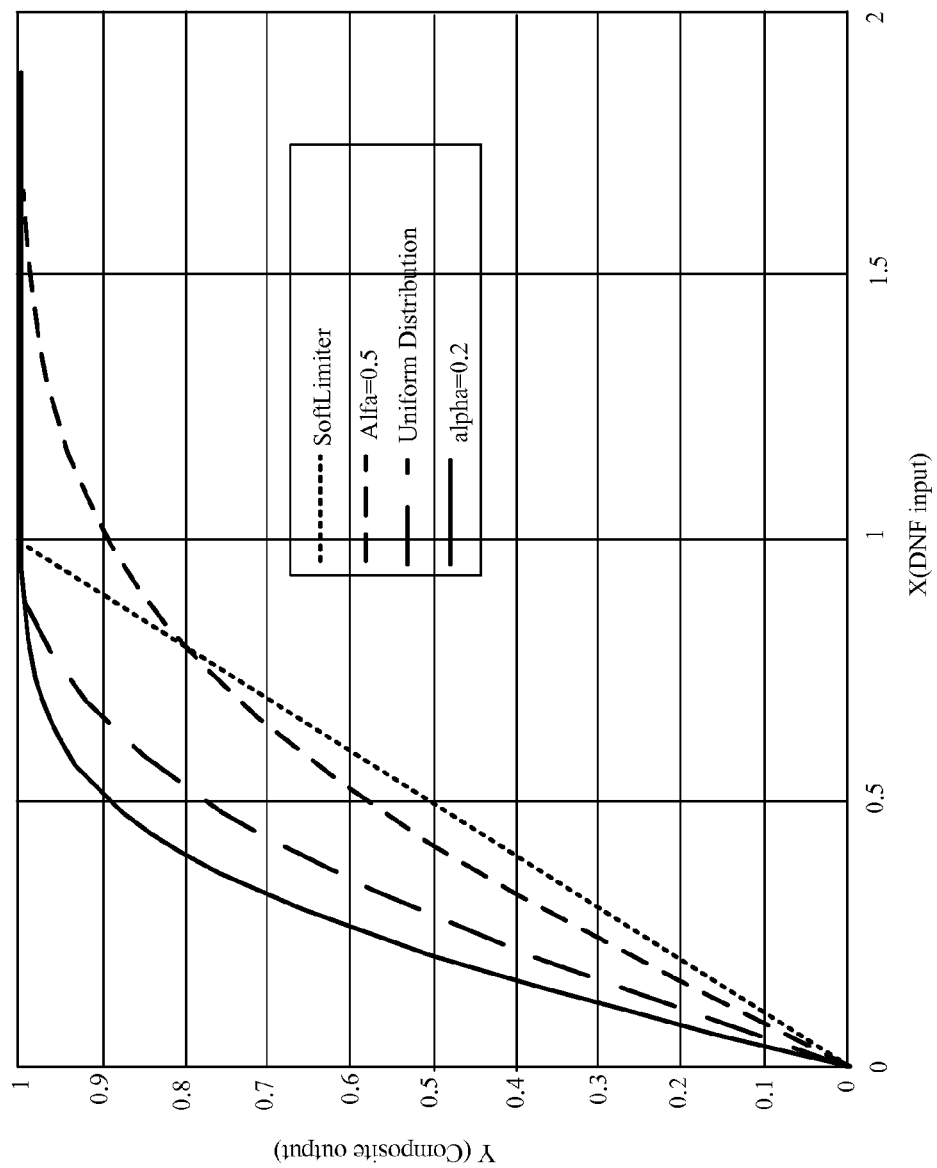
FIG. 4 illustrates an example response of digital nonlinear function circuit.

As can be seen in FIG. 4, the example DNF functions (for $\alpha = 0.5$ and $\alpha = 0.2$) have larger slope at X=0 than a conventional soft limiter, therefore providing lower backoff and cubic metric. On the other hand, they have soft behavior near $A_{SAT}$, thus improving receiver performance. Empirically the soft limiter performance achieved by conventional DPD is lower than the performance achieved using the methods and systems described herein.

In example implementations 1-3, above, the composite $c_{NL}(\ )$ has been optimized. The composite, however, accounts for the responses of both the DNF 102 and the PA 130. Thus, it is needed to compensate DNF for PA existence to get the desired composite. In other words, $f_{NL}(g_{NL}(x)) = c_{NL}(x) => g_{NL}(x) = f_{NL}^{-1}(c_{NL}(x))$, where $g_{NL}(x)$ is nonlinear response of the DNF circuit 102. Accurate modeling of the PA 130 is not needed for this purpose. One alternative is to get desired properties of the DNF circuit 102 itself. For example, with low input backoff to the PA 130, the system could optimize $g_{NL}(x)$ directly instead of $c_{NL}(\ )$.

D. Example 4

In another example implementation, criteria of optimizing $g_{NL}(\ )$ may be used to allow mask compliance at higher transmit power. In some instances, such an optimized $g_{NL}(\ )$ (e.g., optimized using numerical methods) outperforms conventional DPD in terms of mask compliance.

E. Example 5

In another example implementation, $g_{NL}(\ )$ may be optimized (e.g., using numerical methods) to relax the requirements of PA PSD Shaper 108. For example, by optimizing $g_{NL}(\ )$ to reduce distortion at high frequency offsets, the requirements of the PA PSD shaper 108 at high frequency offset are relaxed and therefore the PA PSD Shaper 108 may operate at lower overall sampling rate.

II. DNF PSD Shaper Circuit 104

The DNF PSD shaper circuit 104 may operate to reject out-of-band distortion introduced by the DNF 102. In FIGS. 1 and 2, the Digital Nonlinear Function (DNF) PSD shaper 104 is located right after the DNF circuit 102 and is used to reject distortion components generated by the DNF circuit 102. Since the DNF circuit 102 operates digitally, the distortion component it generates are known exactly and therefore can be completely cancelled before being input to the DAC. Some example implementations of the DNF PSD shaper 104 are discussed next.

In a first example implementation, the DNF PSD shaper 104 is operable to compute the distortion in the frequency domain and cancel it. This may comprise the DNF PSD shaper 104 performing discrete Fourier transform (DFT) on the oversampled DNF output y(n) (e.g. at 2× oversampling) to obtain high frequency content of the output of the DNF circuit 102, which contains out-of-band (OOB) components introduced by the DNF circuit 102. The DNF PSD Shaper 104 may then zero, or attenuate below an applicable spectral mask, the OOB components. The DNF PSD shaper 104 may then perform an inverse DFT (IDFT) to convert the signal back to the time domain.

One drawback with the example implementation just discussed, is that cancelling the OOB components increases the PAPR/cubic metric of the signal. Accordingly, in a second example implementation, the DNF PSD Shaper 104 adjusts the filtering/zeroing of the OOB components based on the resulting cubic metric (e.g., attempts to keep the increase in cubic metric within determined bounds).

In another example implementation, the DNF PSD shaper 104 may actively generate an OOB cancelling signal $d_{ic}[x]$ that, on one hand, attenuates the OOB components, and on the other hand does not increase PAPR/Cubic Metric. This can be expressed as follows:

$$CM(y[n]+d_{ic}[n]) \leq CM_0$$

and $$|F(y[n]+d_{ic}[n])-F(x[n])|^2 \leq \text{DistortionMask}(f)$$

where CM( ) computes the cubic metric; $CM_0$ is a target cubic metric (e.g. 1.3 dB); and DistortionMask($f$) is the maximum allowed DNF distortion mask. For in-band frequencies (as defined by the applicable standard, and which may include some guard band), DistortionMask($f$) takes into account the EVM and in-band emissions. For out-of-band frequencies, DistortionMask($f$) takes into account adjacent channel leakage ratio (ACLR), and spectral emissions requirements, and also incorporates some margin to allow for distortion introduced by the PA 130.

III. PA Compensation Circuit 106

The foregoing discussed ways to optimize the DNF circuit 102 such that signal characteristics at the output of the PA are improved. Since the PA 130 is part of the composite response from the input of the DNF circuit 102 to the output of the PA 130, in some implementations it is desirable or necessary for the transmitter 101 to compensate for the PA 130, in order to get the desired composite response. As compared to conventional DPD, which turns the composite response into a soft limiter (linear response that is clipped at some level), the PA compensation circuit 106 is not a soft limiter, and can use a much less accurate model of the PA 130.

An aim of the PA compensation circuit 106 can be expressed as $$f_{NL}(g_{NL}(x))=c_{NL}(x)$$

Several example implementations of the PA compensation circuit 106 will now be described.

A first example implementation, already discussed above, directly incorporates the response of the PA compensation circuit 106 into the configuration/operation of the DNF circuit 102. By setting $g_{NL}(x)=f_{NL}^{-1}(c_{NL}(x))$, then $c_{NL}(x)=f_{NL}(g_{NL}(x))$. With this approach, the transmitter 101 doesn't need a separate PA compensation circuit 106 in order to comply with an applicable mask and enable sufficient receiver performance.

In another example implementation, the PA compensation circuit 106 is separated from the DNF circuit 102 and the PA Compensation circuit 106 is applied to the output of the DNF PSD Shaper 104. In other words, the processing performed by the PA compensation circuit 106 is $s_{[n]}=f_{NL}^{-1}(z_{[n]})$ (where $f_{NL}(\ )$ may be an approximation). An advantage of the PA compensation circuit 106 operating on the output of the DNF PSD Shaper 104 is that is reduces OOB distortion introduced by the PA 130.

IV. Iterative PA PSD Shaper Circuit 108

FIG. 2 shows details of an example implementation of the PA PSD shaper 108. The example implementation comprises a discrete Fourier transform (DFT) circuit 208, an inverse DFT (IDFT) 210, a composite nonlinear distortion modeling circuit 212, DFT circuit 214, a bin modification circuit 216, a memory 218, a switch 220, and a combiner 222.

The DFT circuit 208 is operable to convert the time-domain signal s(n) to frequency-domain signal S[k] (e.g., using a fast Fourier transform algorithm). The IDFT circuit 210 is operable to convert the frequency-domain signal A[k] to time-domain signal a(n). The discrete Fourier transform (DFT) circuit 208, an inverse DFT (IDFT) 210 may be synchronized to OFDMA or single carrier frequency division multiple access (ScFDMA) symbol time, such that out-of-band corrections would be orthogonal to the desired signal.

The composite nonlinear distortion modeling circuit 212 processes the time-domain signal a(n) to distort the signal using the composite nonlinear distortion model $c_{NL}(\ )$. In FIG. 2, $c_{NL}(\ )$ may be the composite response of DNF circuit 102, DNF PSD shaper 104, PA compensation circuit 106, and PA 130. Thus, the circuit 212 attempts to distort the signal a(n) in a manner that estimate/predicts the distortion that would result from a(n) passing through the DNF circuit 102, the PA compensation circuit 106, and the PA 130.

The DFT circuit 214 is operable to convert the time-domain signal j(n) to frequency-domain signal J[k] (e.g., using a fast Fourier transform algorithm).

The bin modification circuit 216 is operable to select one or more frequency bins of the signal J[k] to be modified, and modify the selected bin(s). Modification of a bin may comprise, for example, adjusting a real and/or imaginary component (i.e., amplitude and/or phase) of that bin. Additional details of operation of the bin modification circuit 216 are described below.

The combiner 222 comprises circuitry, for example, an adder or adder-subtractor. In the example shown, combiner 222 is configured for of one complex number from another.

The PA PSD shaper circuit 108 may operate to combine its input signal with a pre-distortion signal in order to reject out-of-band distortion due to the PA 130. In an example implementation, the PA PSD shaper circuit 108 may implement an iterative algorithm. The PA PSD shaper circuit 108 may enhance performance in when only a relatively accurate model of the PA 130 is available. As discussed in further detail with reference to FIGS. 3A-3C, in some implementation of the transmitter 101, the PA PSD shaper circuit 108 may be used without use of the other components of the TX nonlinear shaper 100 (i.e., without DNF circuit 102, DNF PSD shaper circuit 104, and PA compensation circuit 106).

A goal of the iterative PA PSD shaper circuit 108 is to mitigate out-of-band (OOB) distortion that may be introduced by the PA 130 and/or the DNF circuit 102 (e.g. when the DNF circuit 102 is located between PA PSD shaper 108 and PA 130, as in the example implementations described below with reference to FIGS. 3A-3C). Unlike conventional DPD, the PA PSD shaper 108 does not change the desired signal, which provides a variety of advantages.

For example, where mask requirements are more difficult than EVM requirements (thus permitting correction of out-of-band distortion at the expense of increasing in-band distortion), as is the case for some communication standards such as LTE ScFDMA, keeping the desired signal intact may reduce the power of pre-distortion signal for the same level of out-of-band rejection (since no need to correct in-band), thus allowing the PA PSD shaper 108 to operate at stronger compression than a conventional DPD system while achieving the same level of out-of-band rejection.

Also, unlike conventional modulation, the fact that the PA PSD shaper 108 keeps the desired signal intact mean that it may be used even in conjunction with high modulations requiring low EVM, when the receiver is capable of dealing with nonlinear distortion introduced by both the PA 130 and the PA PSD shaper 108.

Furthermore, when used with the DNF circuit 102, the fact that the PA PSD shaper circuit 108 keeps the desired signal intact means that desired/intended nonlinearity introduced by the DNF circuit 102 is not disturbed (e.g., not inverted).

The desired signal is a frequency region, e.g. a subset of OFDM bins. As a non-limiting example for illustration, but not limitation, the desired signal in a frequency division multiple access channel (e.g. uplink OFDMA or uplink ScFDMA) may be considered to be either: (1) the entire carrier bandwidth including guard bands; (2) the allocation of a single user within the multiple concurrent OFDMA/ScFDMA allocations sharing the carrier bandwidth; or (3) some superset or subset thereof. In the first case, the PA PSD shaper circuit 108 may correct only distortion violating the transmission mask (not touching in band and guard band distortion). In the second case, the PA PSD shaper 108 also corrects distortion that may leak into frequency bins allocated to other users.

In an example implementation, the iterative PA PSD shaper 108 may correct distortion in the frequency domain (e.g. the OFDM bins domain, that is, correct distortion on an OFDM-bin-by-OFDM-bin basis) by transmitting over frequency regions, not including the desired signal (Desired OFDM bins), a pre-distortion signal generated to cancel the out-of-band distortion introduced by DNF circuit 102, the PA 130, and/or other components of the transmitter 101. When cancellation is done in the OFDM bins domain, the PA PSD shaper circuit 108 can restore OFDMA orthogonality despite the PA compression-induced distortion. Therefore, the TX nonlinear shaper 100 can manage both mask and in-band orthogonality requirements.

As mentioned above, the PA PSD shaper 108 may be used independent of the other components of the Tx nonlinear shaper 100. Examples of this are shown in FIGS. 3A-3C. When applied separately, the PA PSD shaper 108 may improve performance even in communication systems where the receiver is not equipped to handle deep communication signal distortion (e.g., by measuring and modeling the nonlinear response.) In this regard:

Assuming the composite response of the analog front-end is known (including both linear and nonlinear components), the PA PSD shaper 108 may be used to cancel the out-of-band distortion (to comply with applicable transmission mask) for any communication system.

In some communication systems having out-of-band mask requirement that are tougher than error vector magnitude (EVM) requirement, power may, due to nonlinear distortion introduced by the PA 130, need to be reduced to maintain mask compliance while not being limited by receiver EVM. One example is LTE uplink (UL) single carrier FDMA (ScFDMA), the same is typical with other mobile telephony and cellular standards. In this case, use of the PA PSD shaper circuit 108 without the DNF circuit 102, the DNF PSD shaper circuit 104, and the PA compensation circuit 106 may sufficiently reduce out-of-band distortion to meet mask requirements, at the expense of somewhat increasing EVM. In other words, the PA PSD Shaper 108 may enable taking advantage of the EVM headroom. Moreover, in this scenario of not being EVM limited, loss in sensitivity as a result of the use of the PA PSD shaper 108 may be negligible, thus not requiring an advanced receiver that is equipped (e.g., with nonlinearity measuring and/or modeling circuitry) to compensate for the nonlinear distortion introduced by the PA PSD Shaper 108.

When the PA 130 is linearized by a Digital Pre Distortion and/or envelope tracking circuit (DPD/ET circuit 306 of FIGS. 3A-3C), the composite response of the PA nonlinear response is substantially a soft limiter (i.e. linear response for signals with power below threshold, and saturation for signal with power above threshold). In this case, the composite response of the DPD/ET circuit 306 and PA 130 can be specified simply by saturation power (below which DPD/ET/PA provide a linear response), thus simplifying the configuration and operation of the PA PSD shaper 108. (When the PA PSD Shaper 108 is used without the DPD/ET circuit 306, the nonlinear response of the PA 130 may be tracked and provided to the PA PSD Shaper 108.)

Figure 3A:
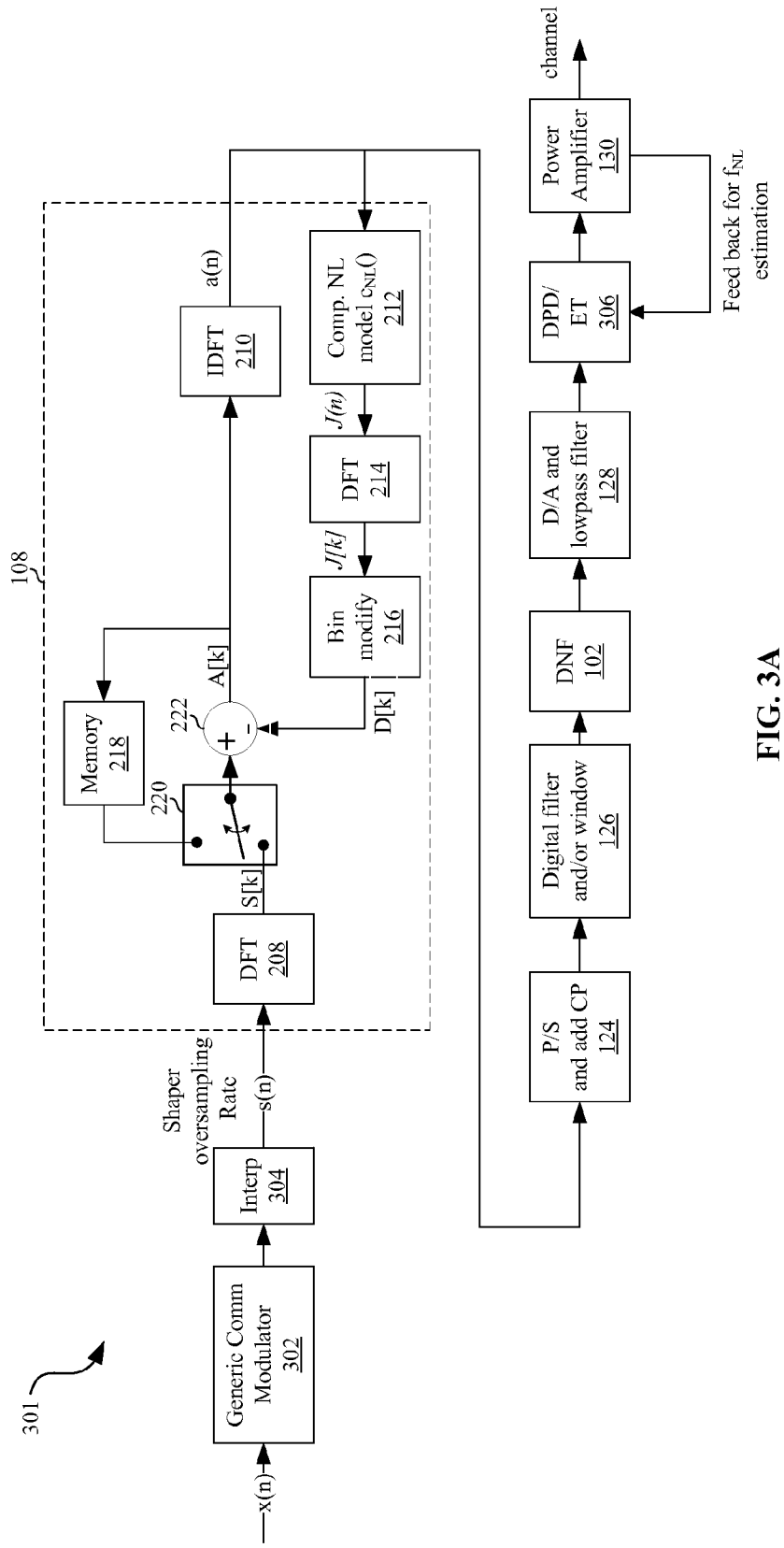
FIGS. 3A-3D depict example transmitters which uses a PA PSD shaper circuitry with or without other aspects of the TX nonlinear shaping circuitry of FIG. 1.

Referring to FIG. 3A, the example transmitter 301 comprises a generic modulator 302, an interpolator 304, the PA PSD Shaper 108, the P/S and CP circuit 124, the filtering and/or windowing circuit 126, the DNF circuit 102, the DAC and lowpass filter circuit 128, the DPD/ET circuit 306, and the PA 130. The generic modulator 302 represents any communication signal modulator such as, for example, an OFDM, OFDMA, single carrier, single carrier FDMA (ScFDMA) modulator.

Figure 3B:
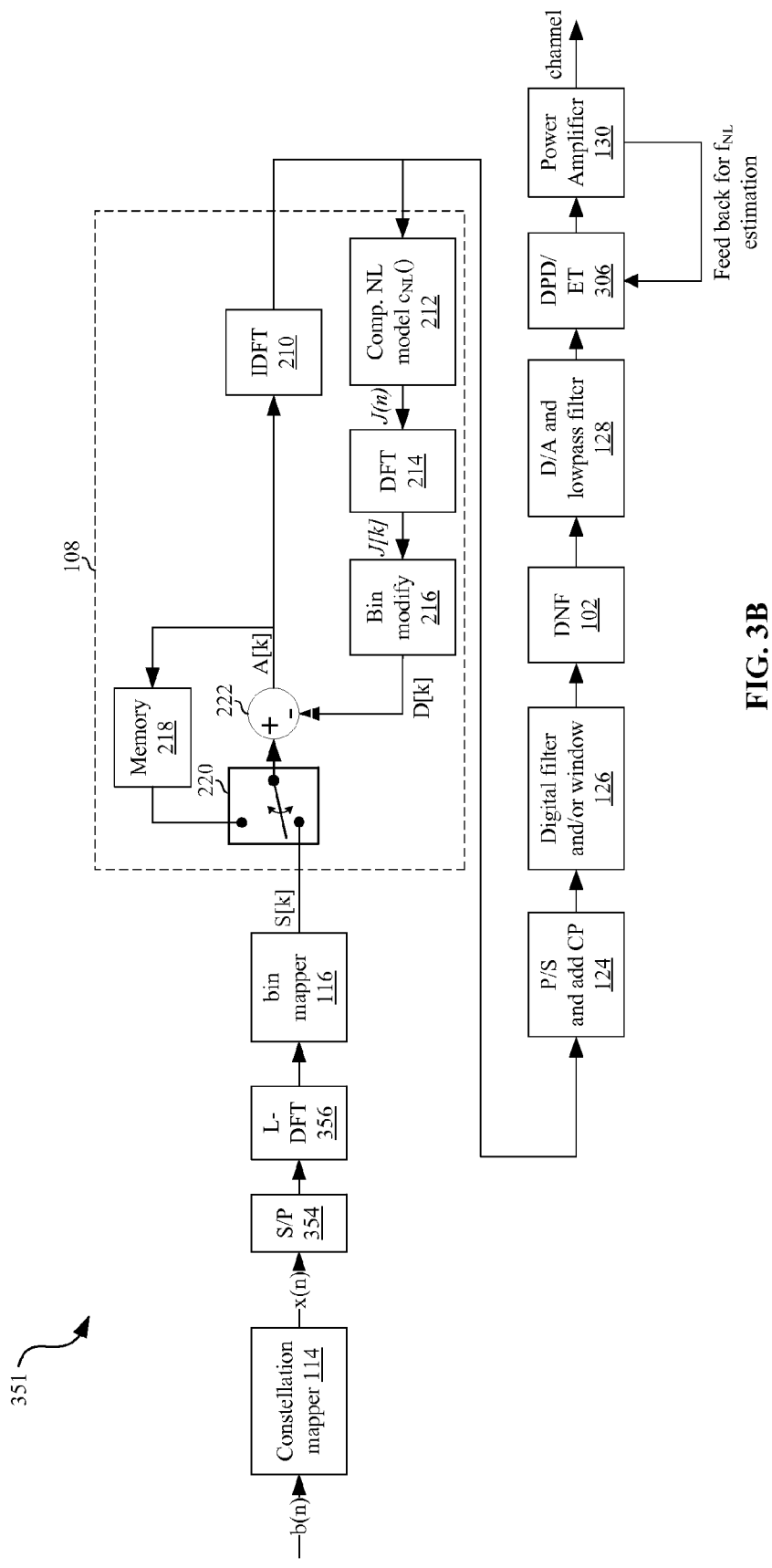

Referring to FIG. 3B, the transmitter 351 is similar to the transmitter 101 but with the generic modulator 302 replaced by a ScFDMA modulator composed of the constellation mapper 114, a serial-to-parallel conversion circuit 354, an L-DFT circuit 356, and bin mapper 116. In FIG. 3B, the DFT 208 is absent, or bypassed, since x(n) is already in the frequency domain.

Figure 3C:
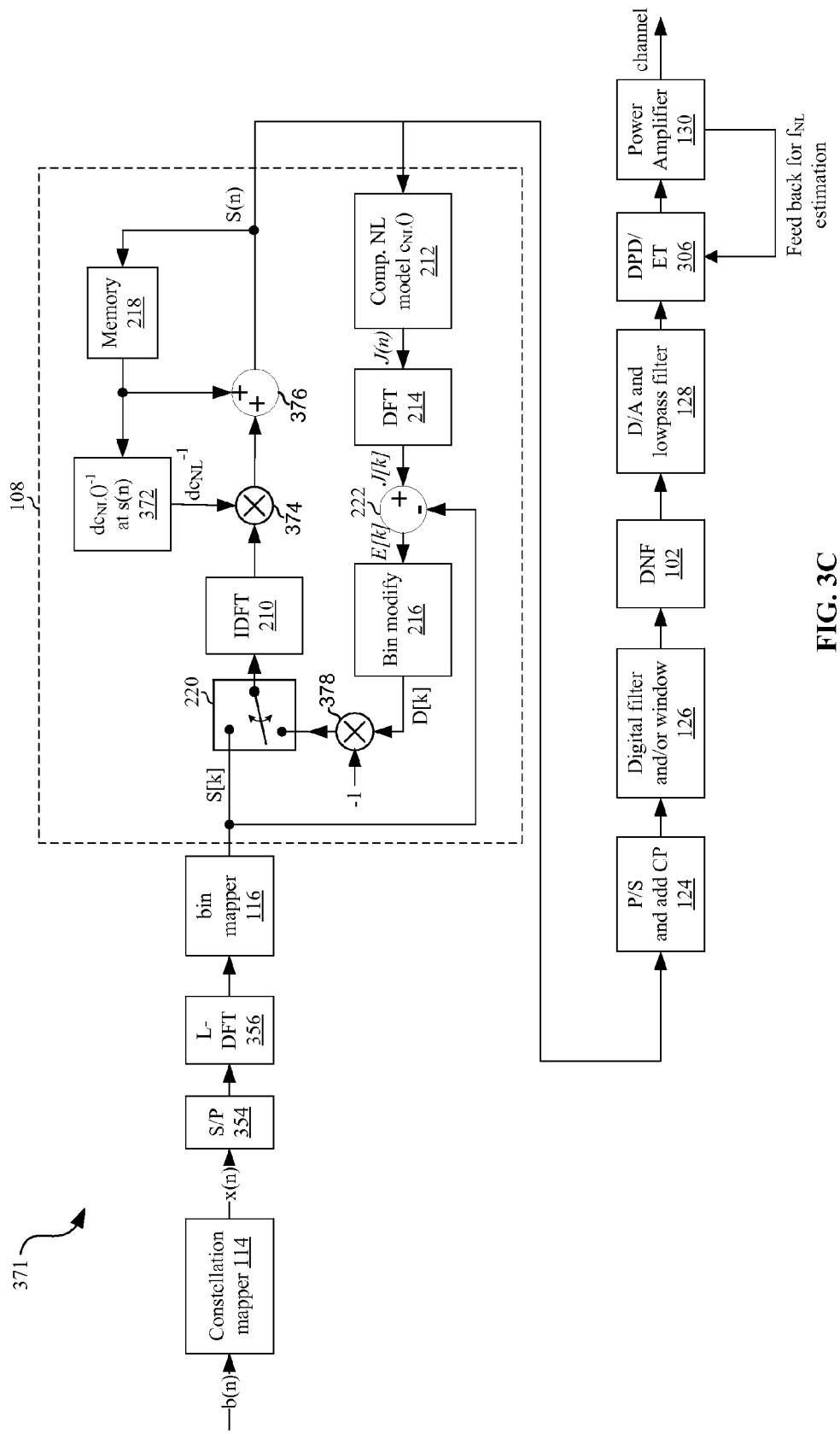

Referring to FIG. 3C, the transmitter 371 is similar to the transmitter 351 but with a different implementation of the PA PSD shaping circuit 108. In FIG. 3C, when the PA PSD Shaper is ready for the next S[K] from bin mapper 116, the switch 220 is configured to convey S[K] to IDFT 210. IDFT 210 then transforms S[K] to a time domain representation. During iteration i on symbol S[K], the output of IDFT 210 is scaled, by matrix multiplier 374, by $dc_{NL}^{-1} @ S_{i-1}(n)$, which is the inverse of the derivative of the composite nonlinear distortion model at the point corresponding to the value of $S_{i-1}(n)$ (stored in memory 218). For the first iteration (i.e., i=1) on a particular symbol, the signal stored in memory 218 may be all zeros, and, assuming the $c_{NL}$ is normalized, $dc_{NL}^{-1}$ at 0=1. For any second and subsequent iteration i on the same symbol, the value stored in the memory 218 is $S_{i-1}(n)$. The output of multiplier 374 is then added to the output of memory 218 to generate S[n]. $S_i[n]$ is then distorted by circuit 212 to generate $J_i(n)$. The signal $J_i(n)$ is then transformed to the frequency domain signal $J_i[k]$ by DFT circuit 214. S[k] for the current symbol is then subtracted off of $J_i[k]$ by combiner 222 to generate $E_i[k]$. Bin modification circuit 216 then operates on $E_i[k]$ to generate the pre-distortion signal $D_i[k]$, which is multiplied by −1 before being fed back via the switch 220 for iteration i+1 on the current symbol (if i is not the last iteration). In an example implementation, the derivative of $c_{NL}(\ )$ may be calculated using the Jacobian—viewing the complex function $C_{NL}$, which has complex input and complex output (C→C), as real function with two-dimensional real input and two-dimensional real output ($R^2 \rightarrow R^2$). That is, $dc_{NL}^{-1}$ may be calculated as the generalized inverse of the Jacobian matrix.

In FIGS. 3A-3C, the P/S and CP circuit 124 is present only for multi-carrier modulations (OFDM, OFDMA, SCFDMA) and not for single carrier modulations. Similarly, the DNF circuit 102 is optional in the transmitters of FIGS. 3A-3C.

In FIGS. 3A-3C, the DNF 102 is optional and is as described above with respect to FIGS. 1 and 2. In transmitters 301 and 351, however, the DNF circuit 102 is a part of the composite nonlinear response of the DNF circuit 102, the DPD/ET circuit 306, and the PA 130. Assuming the DPD/ET circuit 306 effectively linearizes the PA 130 (i.e. the composite response of the two is a soft limiter), the composite response of the DNF 102, DPD/ET circuit 306, and PA 130 will resemble the response of the DNF circuit 102 for input powers below the saturation point. If the DNF circuit 102 were omitted in transmitters 301 and 351, the composite nonlinear response of the DPD/ET circuit 306 and PA 130 is a soft limiter response. Since, in this case, the PA PSD Shaper 108 precedes the DNF 102, it handles the nonlinearity introduced both by the DNF 102 and by the linearized PA response (i.e., the soft limiter response of the DPD/ET circuit 306 and PA 130).

Operation of the example transmitter 301 will now be described. Transmission symbols x[n] are modulated by modulator 302 and then interpolated to a shaper oversampling rate. The resulting samples s(n) are converted to frequency by DFT circuit 208, the resulting frequency domain signal is denoted S[k]. In an example implementation, the PA PSD shaper 108 processes S[k] in an iterative way, using a relatively accurate composite nonlinear distortion model $c_{NL}(\ )$. For the first iteration on a particular symbol, the switch 220 is configured to connect the output of the DFT 208 to the combiner 222. The signal S[k] is combined with an initial value of D[k] (output by bin modification circuit 216) to result in an initial value of A[k]. A[k] is then stored to memory 218. For subsequent iterations (if any) on the same symbol, the switch 220 is configured to connect the output of memory 218 to the input of the combiner 222. That is, for second and subsequent iterations on a particular symbol, A[k] is generated from the value of A[k] generated during the previous iteration. In each iteration, A[k] is converted to time domain signal a(n) by IDFT circuit, then circuit 212 distorts the signal a(n) according to $c_{NL}(\ )$ to generate signal j(n). The distorted signal j(n) is then converted to frequency domain signal J[k].

In an example implementation, the frequency bins of signal J[k] corresponding to desired signal (i.e., the desired frequency bins of signal S[k]) are then zeroed by bin modification circuit 216, resulting in the frequency distortion signal D[k]. That is, in such an implementation, the signal D[k] is zero valued in one or more frequency bins corresponding to the desired signal and non-zero valued in other bins. These non-zero values of the signal D[k] thus correspond to interference cancelling signals located in undesired frequency bins (i.e., in FIG. 3A, out-of-band frequency bins and/or frequency bins that are in-band but allocated to transmitters other than 301). The frequency distortion signal D[k] is then subtracted from A[k] of the previous iteration (output by memory 218) and the process may be repeated for one or more iterations (e.g. resulting in 1 to 4 iterations in total). In such an implementation, distortion is moved ("shaped") from undesired frequency bins to desired frequency bins. Thus, upon completion of the $i^{th}$ iteration on a particular symbol, A[k] comprises the original S[k] combined with a pre-distortion signal which is the cumulative result of i values of D[k].

In an example implementation, the frequency bins of signal J[k] corresponding to undesired signal (i.e., undesired frequency bins of signal S[k] and/or additional frequency bins not corresponding to components of signal s(n)) are then zeroed by bin modification circuit 216, resulting in the frequency distortion signal D[k]. That is, in such an implementation, the signal D[k] is zero valued in one or more bins corresponding to undesired signal and non-zero valued in one or more frequency bins corresponding to the desired signal. These non-zero values of the signal D[k] thus correspond to interference cancelling signals located in desired frequency bins (i.e., in FIG. 3A, frequency bins allocated to the transmitter 301). The frequency distortion signal D[k] is then subtracted from A[k] of the previous iteration (output by memory 218) and the process may be repeated for one or more iterations (e.g. resulting in 1 to 4 iterations in total). Thus, upon completion of the $i^{th}$ iteration on a particular symbol, A[k] comprises the original S[k] combined with a pre-distortion signal which is the cumulative result of i values of D[k].

After the $i^{th}$ iteration on a particular symbol, a next symbol S[k] arrives at the PA PSD Shaper 108 and the process repeats. Thus, D[k] is updated for each symbol and thus is periodic with a periodicity synchronized to the symbol timing of S[k].

In the above example, the bin modification circuit 216 gives each bin of J[K] a weight of either 0 or 1 which results in each bin of J[K] being either completely subtracted from A[K], or not at all subtracted. The bin modification circuit 216 is not, however, limited to using only weights of 0 and 1. Any real or complex weights may be used. For example, relatively lower, non-zero real weights may be used for weaker cancellation of distortion on a first set of bins, and relatively higher, non-zero real weights may be used for stronger cancellation of distortion on a second set of bins. Such weightings may be chosen, for example, based on a priori knowledge that weaker cancellation suffices on the first set and/or that stronger cancellation is need on the second set. Alternately, PA PSD Shaper may change the weights dynamically from iteration to iteration based on an amount of excess distortion in a bin at the end of a previous iteration. For example, if distortion of a specific bin is lower than a determined threshold (e.g., determined based on the applicable standard, based on knowledge of the intended receiver, and/or the like) then PA PSD shaper 108 may use a low weight for partial distortion cancellation for that bin, but if distortion is above the threshold, the PA PSD Shaper may apply a higher weight (e.g. up to a weight of 1 to fully cancel distortion for that bin).

In an example implementation, the bin mapper circuit 116 and/or the bin modification circuit 216 may apply a complex weight to frequency bins of signal S[k] corresponding to pilots. Such a weighting may enable better channel estimation in a receiver and thus reduce EVM in the receiver. To explain, the transmitter may insert pilots which a receiver may use to train its equalizer. The pilots may be, for example, scattered among the bins of an OFDM symbol or may be on all bins of certain SC-FDMA symbols (e.g., the UL Reference signal in LTE). Pilots, however, have low-PAPR and thus do not experience significant nonlinear distortion. Therefore, equalizer training based on such low-PAPR pilots does not take into account the nonlinear distortion introduced by the system (including, for example, the PA PSD Shaper 108, the DNF 102, the DPD 306, and/or the PA 130). In some instances, where the receiver is capable, this may be compensated for by providing the nonlinear model ($C_{NL}$) to the receiver (e.g., via a control channel) and the receiver may thus take it into account when configuring its equalizer and/or other circuitry. In other instances (e.g., in the case of a conventional LTE receiver), however, the receiver is not capable of receiving $C_{NL}$ and knowing how to use it for configuring its circuitry. In these other instances, the transmitter may intentionally distort the pilot symbols (i.e., modify the amplitude and/or phase of the pilots) so that equalizer training in the receiver inherently takes the multiplicative part of the distortion into account.

The complex weight applied to bins of S[k] corresponding to pilots is designated Wp here and may correspond to expectancy, over the set of all possible transmission symbols (i.e., for OFDM, all possible OFDM symbols or, for SC-FDMA, all possible SC-FDMA symbols), of the amplitude reduction and phase rotation caused by the nonlinear elements of the transmitter. The expectancy may be calculated from $C_{NL}$ using a model, formula, or lookup table, for example. The expectancy may depend on the particular allocation of bins among the users.

Figure 3D:
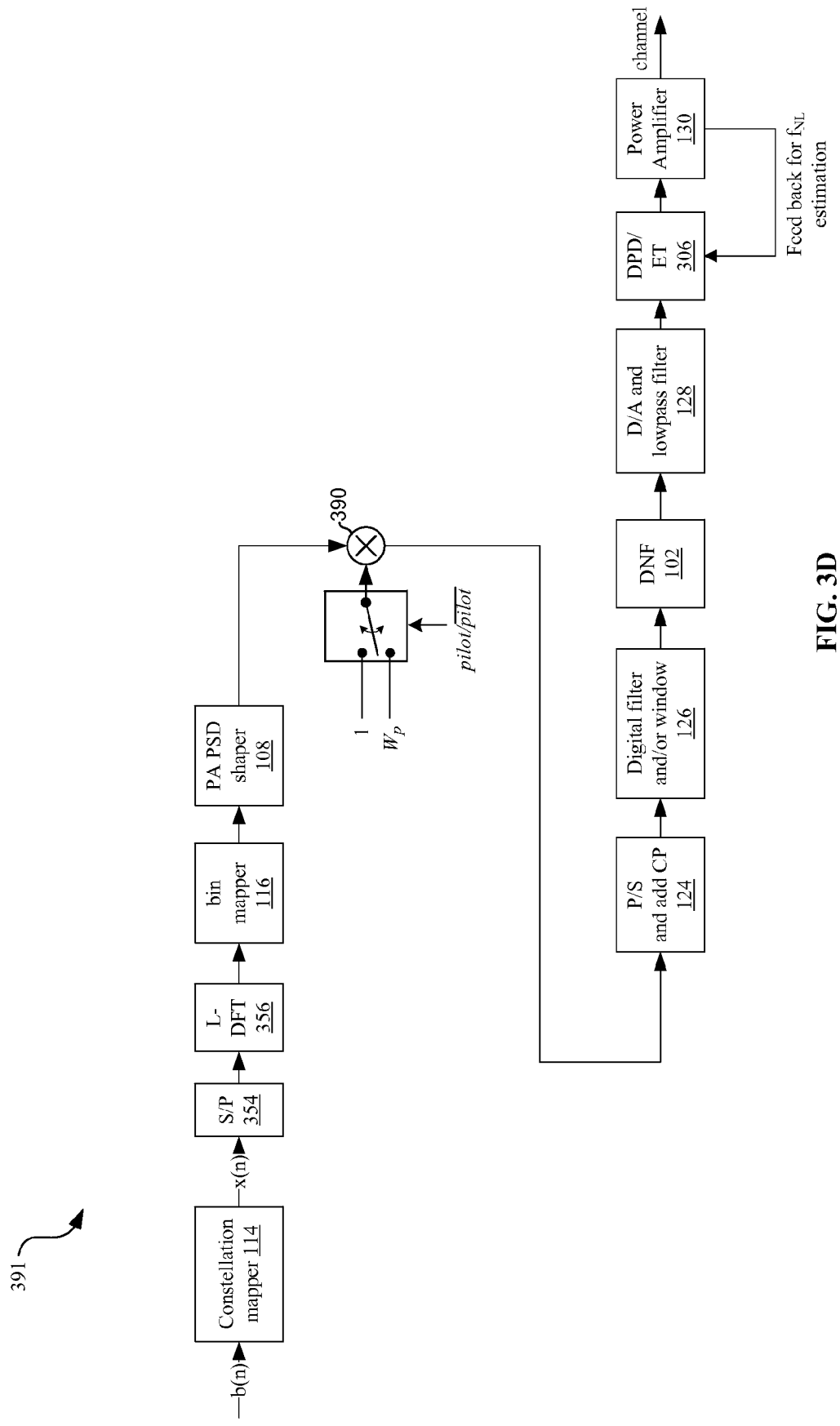

Although the complex weighting of pilots may occur in the frequency domain, as just described, in other implementations it may be applied in the time domain. Complex weighting of pilots in the time domain may be particularly straightforward where all bins of a particular symbol carry pilots, such as in an LTE UL Reference Signal. This is shown in FIG. 3D where multiplier 390 multiplies S(n) by 1 for data symbols and by $W_p$ for pilot symbols.

In an example implementation (e.g., where the transmitter is in a basestation using downlink (DL) OFDMA), the distortion may be shaped by moving it to frequencies allocated for use with relatively lower-order modulation constellations. For example, if out-of-band distortion is too high and is desired to be moved in-band, the frequencies onto which to move that distortion may be selected to be frequencies allocated for use with relatively lower-order modulation constellations. Similarly, if distortion in a first frequency bin is too high and it is desired to move it to a second one or more bin(s), those second bins may be selected from subcarriers using a lower-order modulation constellation than the constellation being used on the first bin. (e.g., the higher-order constellation may be NQAM and the lower order constellation may be MQAM with N>M). Such distortion shaping may be selected to take advantage of the fact that frequencies allocated for use with higher-order modulation constellations would typically require lower distortion floors than the frequencies allocated for use with the lower-order modulation constellations. Such shaping may be achieved by more aggressive cancelling of distortion on frequencies allocated for use with higher-order modulation constellation allocations and less aggressive cancelling (or no cancelling at all) on frequencies allocated for use with lower-order modulation constellations. The PA PSD Shaper 108 may also operate to move distortion from in-band to out-of-band in cases where very low in-band EVM is needed, and out-of-band rejection requirements can tolerate some additional out-of-band distortion.

In an example implementation (e.g., where the transmitter is in a handset using uplink (UL) ScFDMA), different weights to be applied to different in-band allocated frequencies may be determined based on known noise and/or interference at the receiver. For example, if the noise plus interference floor at receiver is not flat by design of the network (e.g., in a network using fractional frequency re-use), such that there is lower interference on some frequencies than others, the bin modification circuit 216 may take this into account when determining weights to apply to the various frequencies.

Operation of the example transmitter 351 will now be described. A bit stream b[ ] is constellation mapped (e.g., according to a selected QAM constellation) into the symbol stream x[n]. S/P circuit 354 groups the symbol stream into groups of size L, where L is the number of frequency bins allocated for ScFDMA burst transmission. A L-size DFT is performed by L-DFT circuit 356 to transform ScFDMA symbols into L frequency domain bins. The bin mapper 116 then maps the resulting L bins according to specific burst allocation in frequency (i.e., maps the bins to the frequencies allocated to the transmitter 351). The output of the bin mapper 116 represents a DPD oversampled signal, and consists of Nfft*DPD_OVS frequency bins (where Nfft corresponds to ScFDMA carrier BW, and DPD_OVS is the DPD oversampling rate). This frequency domain signal is taken directly as signal S[k] and input to the PA PSD shaper 108. The rest of the processing blocks are the same as described for FIG. 3A. This results in the pre-distortion cancellation signal (accumulation of D[k]) being non-overlapping in frequency and synchronized in time to the desired ScFDMA transmission, and therefore—disregarding non-linearity—orthogonal at the base station receiver to the desired ScFDMA transmission. This type of cyclical and synchronized pre-distortion ensures ScFDMA orthogonality despite nonlinear distortion introduced in the transmitter.

In an example implementation, D[k] for the first iteration may be configured based on a priori knowledge about the communication system. In another example implementation, D[k] for the first iteration may be simply all zeroes. In such an implementation, the IDFT circuit 210 may be skipped for the first iteration and circuit 212 may operate directly on s(n) for the first iteration.

In the example implementations of FIGS. 3A-3C, the PA PSD Shaper 108 is followed by adding CP, filtering and OFDM windowing, optionally applying the Digital Nonlinear Function (DNF), and then digital-to-analog conversion. The DAC output is optionally filtered and processed by DPD/ET which drives the input of the PA 130. The DNF circuit 102 and DPD/ET circuit 306 are optional, and thus any combination of DNF circuit 102, DPD/ET circuit 306, and PA 130 determines the composite nonlinear response $c_{NL}(\ )$. That is, the composite nonlinear distortion model $c_{NL}(\ )$ may, for example, be a model of the PA 130 (i.e., $c_{NL}(\ )=f_{NL}(\ )$) if neither DPD/ET circuit 306 nor DNF circuit 102 are in use, a soft limiter model when using DPD/ET circuit 306 in combination with the PA 130, or the response of the DNF circuit 102 when using the DNF 102, DPD/ET circuit 306, and PA 130.

When the DPD/ET circuit 306 is present and DNF circuit 102 is not used (i.e., not present or bypassed), then $c_{NL}(\ )=f_{NL}(\ )$ (an estimation of the nonlinear distortion introduced by PA 130). This model may be a memoryless nonlinearity (in the simpler case), or consist of nonlinearity with memory. Estimation of $f_{NL}(\ )$ may, for example, be based on feedback from the PA 130 and/or based on a priori information about the PA 130 (e.g., its part number, its bias voltage, characterization data from a manufacturer of the PA, etc.).

When the DPD/ET circuit 306 is present, it may use feedback from PA 130 to estimate, and compensate for, $f_{NL}(\ )$. This may result in a composite response that is approximately a soft-limiter (an example soft-Limiter response is shown in FIG. 4). In other words, in this case the $c_{NL}(\ )$ used by the PA PSD Shaper 108 may be either a soft limiter or approximately a soft limiter. In the case that the composite response is approximately a soft limiter, the response of the PA may not be completely inverted and the result may be a time invariant response that may compress when the signal approaches saturation. The compression effect may or may not have memory (i.e., depend on previous data). In the case that the composite response is approximately a soft limiter, a representation of the composite nonlinearity may be conveyed from the DPD/ET circuit 306 to the PA PSD shaper 108. In the case that the composite response is a soft-limiter, only power amplifier input power backoff may need to be conveyed to the PA PSD Shaper 108, thus having a very simple interface. In some implementation, however, a soft limiter response (or approximation thereof), may not provide the best performance when used in conjunction with the PA PSD Shaper 108. In such implementations, the DNF circuit 102 may be used to turn the soft limiter response (or approximation thereof) to a response that provides better performance in conjunction with the PA PSD Shaper 108. In this case, the composite non-linearity $c_{NL}(\ )$ is composed of the response of the DNF circuit 102, the response of the DPD/ET circuit 306, and the response of the PA 130, and may be computed by the DNF circuit 102 processing the composite nonlinearity model provided by the DPD/ET circuit 306.

In an example implementation, the PA PSD shaper 108 may use numerical optimization to, for example, determine which weights to apply to various bins of J[k]. This may comprise optimization of a performance metric using numerical techniques such as gradient descent. One example of such a performance metric is the mean squared error between permissible out-of-band distortion (as set by an applicable standard and/or regulatory body) and the out-of-band distortion predicted by D[k]. The result of the numerical optimization may be that the bin modification circuit 216 weights differently distortion in different frequency bands. For example, the bin modification circuit 216 may apply higher weights to out-of-band distortion components exceeding an applicable spectral mask and lower weights to distortion components leaking into bins allocated to other users. The use of numerical optimization may use, for example, relatively few gradient descent iterations, thus resulting in a cost-effective implementation.

It is noted that, in the example implementations of FIGS. 1-3C, the TX nonlinear shaping operates cyclically (i.e. CP extended), in order to maintain orthogonality to the desired OFDM signal and possibly weight distortion of different OFDM bins differently. However, in another implementation, the TX nonlinear shaping may be applied after adding the cyclic prefix. Such an implementation is also applicable when CP is replaced by PRBS as in TDS-OFDM, but, in that case, the resulting PRBS interference into the desired signal may need to be corrected (as is the case with conventional PRBS CP systems).

Figure 5:
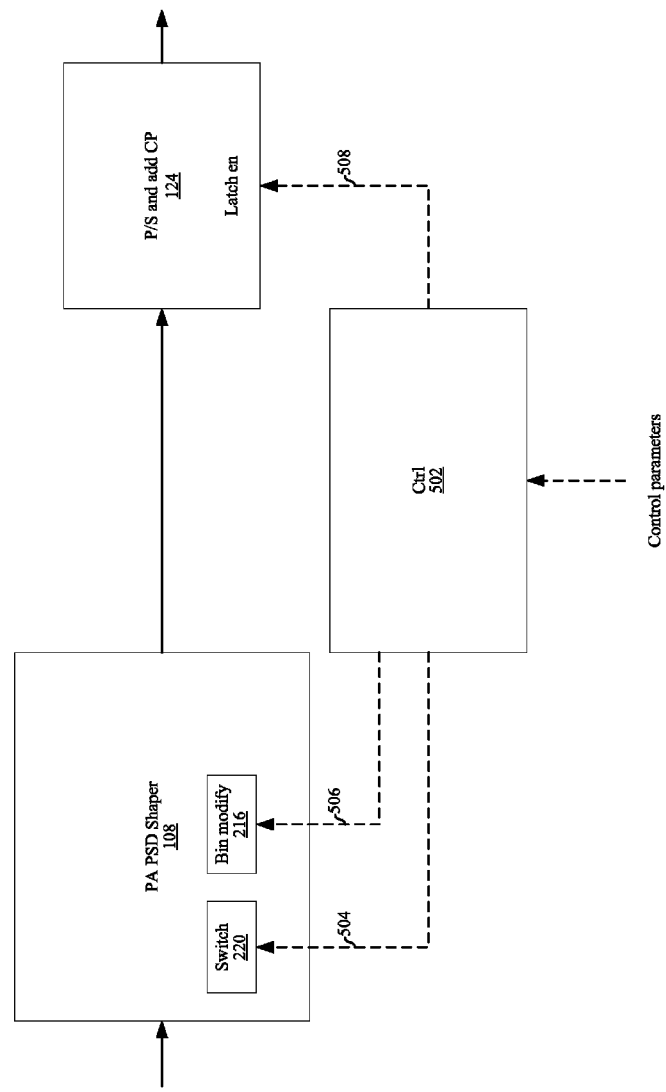
FIG. 5 is a diagram illustrating control of the PA PSD Shaper in accordance with an example implementation of this disclosure.

FIG. 5 is a diagram illustrating control of the PA PSD Shaper in accordance with an example implementation of this disclosure. Shown in FIG. 5 is a block 502 representing circuitry operable to configure and control operation of the PA PSD Shaper 108. The control circuitry 502 may, for example, be implemented by a microcontroller of the transmitter, by dedicated control circuitry, and/or by the PA PSD Shaper 108 itself.

The control circuitry 502 is operable to configure the switch 220. This control circuit is also operable to control when the circuit 124 reads in the output of the PA PSD Shaper 108. Through these two controls, the control circuitry 502 can thus control the number of iterations performed on any given symbol. The number of iterations performed on any particular symbol may be determined a priori and/or in real-time. The number of iterations performed on any particular symbol may be determined based on any one or more of a variety of parameters such as: the constellation used to generate the symbol, the particular constellation points in the symbol, the peak to average power ratio (PAPR) of the symbol, the number of subcarriers in the symbol, which subset of a larger subset of subcarriers have been allocated for transmission of the symbol, a spectral mask of the standard with which transmission of the symbol is to comply, a permissible error vector magnitude (e.g., set by an applicable standard and/or by the capabilities of the receiver for which the symbol is destined), the power backoff setting of the power amplifier, a performance metric, and/or the like. A performance metric used to control the number of iterations may be measured by the transmitter and/or may be measured by a receiver and fed back to the transmitter via a control channel. A performance metric used to control the number of iterations may be, for example, an error (e.g., a difference or squared difference) between the signal S(n) or J(n) and a requirement set forth by an applicable standard (e.g., maximum out-of-band power, EVM, and/or the like).

The control circuitry is also operable to configure the bin modification circuit 216. This may comprise selecting which of the bins may be modified and the extent to which the selected bins may be modified. Configuration of the bin modification circuit 216 may be determined a priori and/or in real-time (e.g., on a per-symbol or per-link basis). The configuration of the bin modification circuit 216 for any particular symbol may be determined based on any one or more of a variety of parameters such as: the constellation used to generate the symbol, the particular constellation points in the symbol, the peak to average power ratio (PAPR) of the symbol, the number of subcarriers in the symbol, which subset of a larger subset of subcarriers have been allocated for transmission of the symbol, a spectral mask of the standard with which transmission of the symbol is to comply, a permissible error vector magnitude (e.g., set by an applicable standard and/or by the capabilities of the receiver for which the symbol is destined), the power backoff setting of the power amplifier, a performance metric, and/or the like. A performance metric used to for configuring the bin modification circuit 216 (e.g., configuring weights applied to various bins for any particular iteration i on a symbol) may be measured by the transmitter and/or may be measured by a receiver and fed back to the transmitter via a control channel. A performance metric used to configure the bin modification circuit 216 may be, for example, an error (e.g., a difference or squared difference) between the signal S(n) or J(n) and a requirement set forth by an applicable standard (e.g., maximum out-of-band power, EVM, and/or the like).

In an example implementation, processing

Figure 6A:
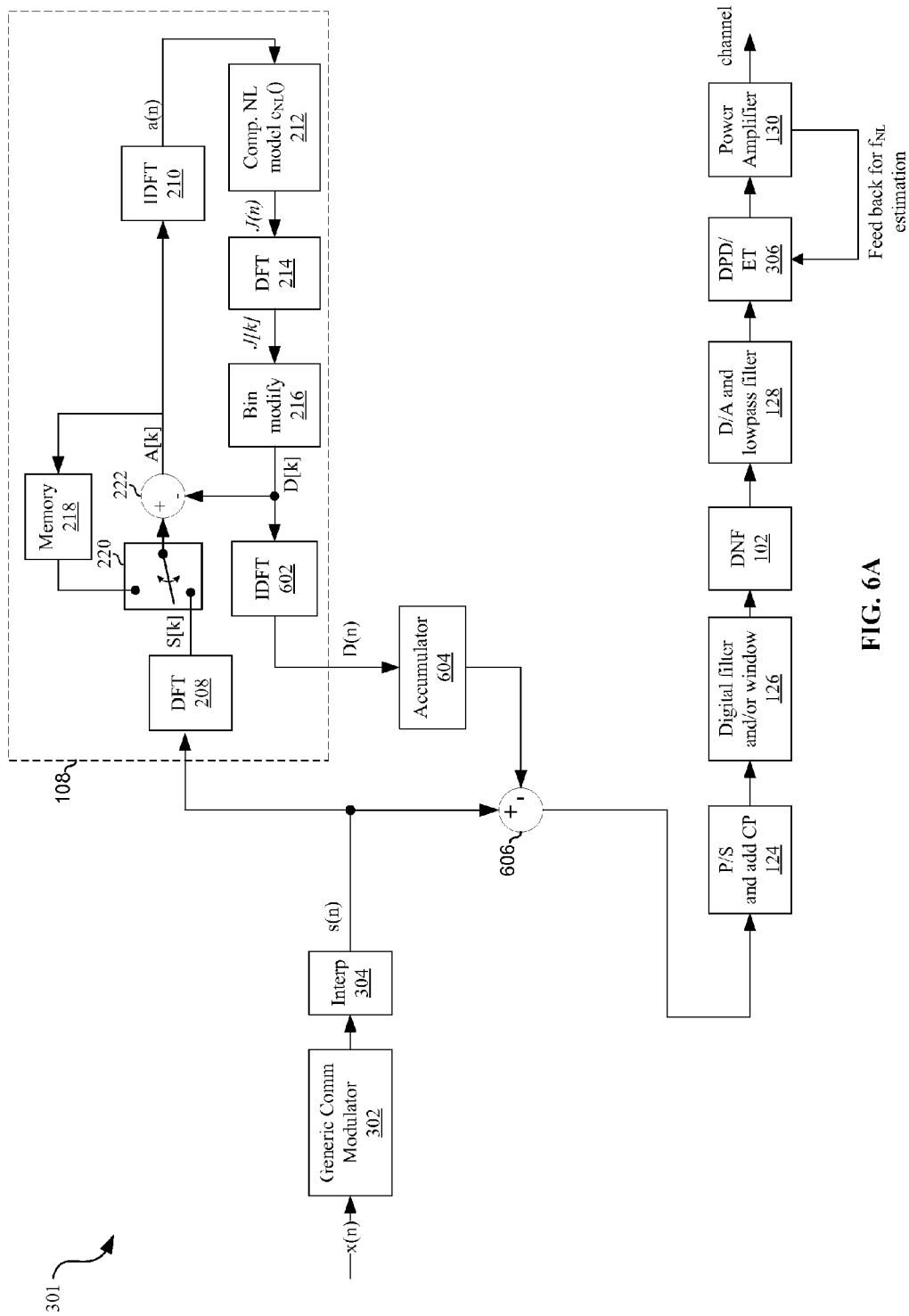
FIG. 6A illustrates an alternate implementation of the transmitter of FIG. 3A.

FIG. 6A illustrates an alternate implementation of the transmitter of FIG. 3A. Relative to the implementation shown in FIG. 3A, the implementation in FIG. 6A additionally comprises IDFT 602, accumulator 604, and combiner 606. The IDFT 602 converts D[k] to a time domain representation D(n). The accumulator 604 then sums the values of D[k] over the iterations on symbol s(n). After the last iteration on symbol s(n), the pre-distortion signal output by the accumulator 604 is subtracted from s(n) by combiner 606. In yet another implementation, D[k] may be accumulated in the frequency domain prior to conversion to time-domain representation which may then be subtracted from s(n).

Figure 6B:
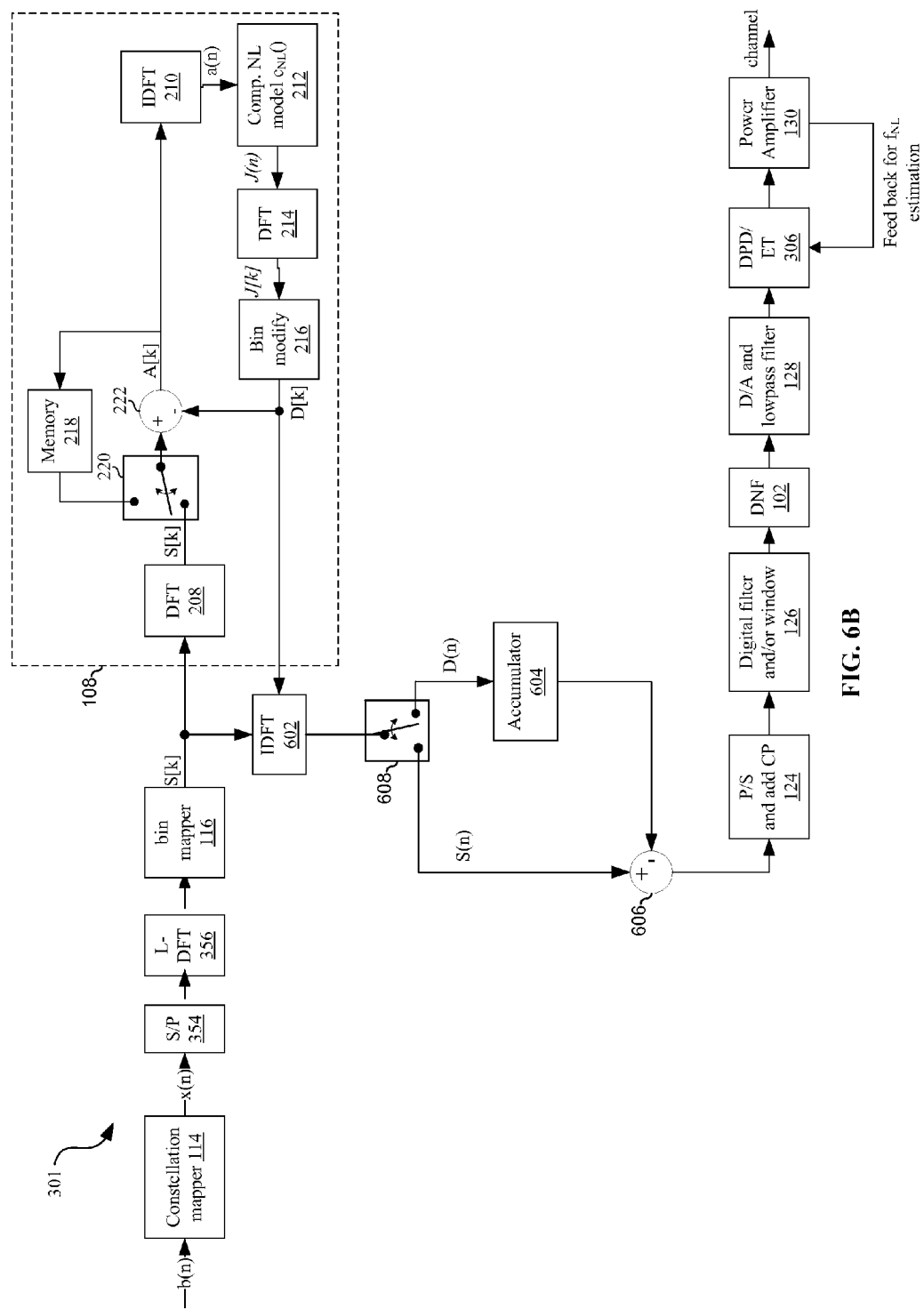
FIG. 6B illustrates an alternate implementation of the transmitter of FIG. 3B.

FIG. 6B illustrates an alternate implementation of the transmitter of FIG. 3B. Relative to the implementation shown in FIG. 3B, the implementation in FIG. 6B additionally comprises IDFT 602, accumulator 604, combiner 606, and switch 608. The IDFT 602 converts D[k] to a time domain representation D(n). The switch 608 routes D(n) to accumulator 604 which sums the values of D[k] over the iterations on symbol s(n). After the last iteration on symbol s(n), switch 608 routes s(n) to the combiner 606 and the pre-distortion signal output by the accumulator 604 is subtracted from s(n) by combiner 606. In yet another implementation, D[k] may be accumulated in the frequency domain prior to conversion to time-domain representation which may then be subtracted from s(n).

In accordance with an example implementation of this disclosure, a transmitter (e.g., 301 or 351) comprises at least one nonlinear circuit, and a power spectral density (PSD) shaping circuit (e.g., 108). The PSD shaping circuit is operable to receive a symbol of a modulated signal (e.g., time domain symbol s(n) or frequency domain symbol s[k]), wherein the symbol corresponds to a first one or more frequency bins. The PSD shaping circuit is operable to perform iterative processing of the symbol, wherein each iteration of the processing comprises: generation of a first pre-distortion signal (e.g., frequency domain signal D[k] or time-domain signal D(n)) based on a model of the at least one nonlinear circuit, wherein the pre-distortion signal corresponds to a second one or more frequency bins; and combination of the symbol (e.g., S[k]), or a pre-distorted version of the symbol (e.g., A[k]), with the pre-distortion signal. The generation of the pre-distortion signal may comprises generation of a nonlinearly-distorted signal (e.g., J(n) or J[k]), and adjustment of one or more components of the nonlinearly-distorted signal.

The adjustment may comprise weighting the one or more components of the nonlinearly-distorted signal. The weighting may be determined per frequency bin or per group of frequency bins. The weighting may be determined based on distortion remaining in the pre-distorted signal after an iteration of the iterative processing of the symbol. The one or more components may be in one or more desired signal frequency bands. The one or more desired signal frequency bands may be frequency bands assigned to the transmitter by a basestation. The one or more components may be in one or more undesired signal frequency bands. The one or more undesired signal frequency bands may be out-of-band frequency bands. The one or more undesired signal frequency bands may be frequency bands allocated, by a basestation, to one or more other transmitters. The adjustment of the one or more components may be controlled (e.g., by circuit 502) based on a performance metric (e.g., SNR) fed back to the transmitter from a receiver. The adjustment of the one or more components may be controlled based on order of a modulation constellation used for generation of the symbol. The adjustment of the one or more components may be controlled based on a determination of interference present at a receiver to which said symbol is to be transmitted.

The adjustment of the one or more components may be controlled based on which frequency bands have been allocated to the transmitter by a basestation. The adjustment of the one or more components may results in shifting distortion from out-of-band frequencies to in-band frequencies or from in-band frequencies to out-of-band frequencies. The adjustment of the one or more components may result in shifting distortion from in-band frequencies to out-of-band frequencies. The adjustment of the one or more components may be controlled based on whether a receiver to which the symbol is destined comprises circuitry for modeling and mitigating nonlinear distortion introduced by the transmitter. The at least one nonlinear circuit may comprise a power amplifier and/or a digital pre-distortion circuit. The at least one nonlinear circuit may comprise a digital nonlinear function circuit configured to compress a signal to be transmitted prior to input of the signal to be transmitted to a power amplifier of the transmitter. The said generation of the pre-distortion signal may be based on a seeking of a minimum, maximum, or desired value (e.g., above or below a threshold) of a performance metric. The transmitter may comprise a pilot distortion circuit (e.g., bin mapper 116 or multiplier 390) operable to distort pilots of said symbol.

In accordance with an example implementation of this disclosure, a transmitter (e.g., 301 or 351) may comprise a modulator circuit, a combiner circuit (e.g., 222 and/or 606), a nonlinear distortion modeling circuit (e.g., 212), and a modification circuit (e.g., 216). The modulator is operable to generate a symbol to be transmitted (e.g., time domain symbol s(n) or frequency domain symbol s[k]). The combiner circuit is operable to combine the symbol with a first portion of a pre-distortion signal (e.g., D[k] for a first iteration), a result of the combination being a pre-distorted signal (e.g., a(n)). The nonlinear distortion modeling circuit is operable to: model nonlinear distortion introduced by at least one nonlinear circuit of the transmitter; and nonlinearly distort the pre-distorted signal, a result of the nonlinear distortion being a distorted signal (e.g., J(n) or J[k]). The modification circuit is operable to modify the distorted signal to generate a second portion of a pre-distortion signal (e.g., D[k] for a second iteration). The modification of the distorted signal may be on a per subcarrier basis. The modification of the distorted signal by the modification circuit may comprise zeroing spectral components of the distorted signal.

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set {(x), (y), (x, y)}. In other words, "x and/or y" means "one or both of x and y". As another example, "x, y, and/or z" means any element of the seven-element set {(x), (y), (z), (x, y), (x, z), (y, z), (x, y, z)}. In other words, "x, y and/or z" means "one or more of x, y and z". As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.).

Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the processes as described herein.

Accordingly, the present invention may be realized in hardware, software, or a combination of hardware and software. The present invention may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein. Another typical implementation may comprise an application specific integrated circuit or chip.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A transmitter comprising:
   at least one nonlinear circuit; and
   a power spectral density shaping circuit configured to:
      receive a symbol of a modulated signal, wherein said symbol corresponds to a first one or more frequency bins; and
      perform iterative processing of said symbol, wherein each iteration of said processing comprises:
         generation of a pre-distortion signal based on a model of said at least one nonlinear circuit, wherein said pre-distortion signal corresponds to a second one or more frequency bins; and
         combination of said symbol, or a pre-distorted version of said symbol, with said pre-distortion signal.

2. The transmitter of claim 1, wherein said generation of said pre-distortion signal comprises:
   generation of a nonlinearly-distorted signal; and
   adjustment of one or more components of said nonlinearly-distorted signal.

3. The transmitter of claim 2, wherein said adjustment comprises weighting said one or more components of said nonlinearly-distorted signal.

4. The transmitter of claim 3, wherein:
   said weighting is determined per frequency bin or per group of frequency bins; and
   said weighting is determined based on distortion remaining in said pre-distorted signal after an iteration of said iterative processing of said symbol.

5. The transmitter of claim 2, wherein said one or more components are in one or more desired signal frequency bands.

6. The transmitter of claim 5, wherein said one or more desired signal frequency bands are frequency bands assigned to said transmitter by a basestation.

7. The transmitter of claim 2, wherein said one or more components are in one or more undesired signal frequency bands.

8. The transmitter of claim 7, wherein said one or more undesired signal frequency bands are out-of-band frequency bands.

9. The transmitter of claim 7, wherein said one or more undesired signal frequency bands are frequency bands allocated, by a basestation, to one or more other transmitters.

10. The transmitter of claim 2, wherein said adjustment of said one or more components is controlled based on a performance metric fed back to said transmitter from a receiver.

11. The transmitter of claim 2, wherein said adjustment of said one or more components is controlled based on order of a modulation constellation used for generation of said symbol.

12. The transmitter of claim 2, wherein said adjustment of said one or more components is controlled based on a determination of interference present at a receiver to which said symbol is to be transmitted.

13. The transmitter of claim 2, wherein said adjustment of said one or more components is controlled based on which frequency bands have been allocated to said transmitter by a basestation.

14. The transmitter of claim 2, wherein said adjustment of said one or more components results in shifting distortion from out-of-band frequencies to in-band frequencies.

15. The transmitter of claim 2, wherein said adjustment of said one or more components results in shifting distortion from in-band frequencies to out-of-band frequencies.

16. The transmitter of claim 2, wherein said adjustment of said one or more components is controlled based on whether a receiver to which said symbol is destined comprises circuitry for modeling and mitigating nonlinear distortion introduced by said transmitter.

17. The transmitter of claim 1, wherein said at least one nonlinear circuit comprises a power amplifier.

18. The transmitter of claim 1, wherein said at least one nonlinear circuit comprises a digital pre-distortion circuit.

19. The transmitter of claim 1, wherein said at least one nonlinear circuit comprises a digital nonlinear function circuit configured to compress a signal to be transmitted prior to input of said signal to be transmitted to a power amplifier of said transmitter.

20. The transmitter of claim 1, wherein said generation of said pre-distortion signal is based on a seeking of a minimum, maximum, or desired value of a performance metric.

21. The transmitter of claim 1, further comprising a pilot distortion circuit configured to distort pilots of said symbol.

22. A transmitter comprising:
 a modulator circuit configured to generate a symbol to be transmitted;
 a combiner circuit configured to combine said symbol with a first portion of a pre-distortion signal, a result of said combination being a pre-distorted signal;
 a nonlinear distortion modeling circuit configured to:
  model nonlinear distortion introduced by at least one nonlinear circuit of said transmitter; and
  nonlinearly distort said pre-distorted signal, a result of said nonlinear distortion being a distorted signal; and
 a modification circuit configured to modify said distorted signal to generate a second portion of said pre-distortion signal.

23. The transmitter of claim 22, wherein said modification circuit is configured to modify said distorted signal on a per subcarrier basis.

24. The transmitter of claim 23, wherein modification of said distorted signal by said modification circuit comprises weighting spectral components of said distorted signal.

25. The transmitter of claim 22, wherein said at least one nonlinear circuit comprises a digital pre-distortion circuit and a power amplifier circuit.

26. A transmitter comprising:
 a modulator circuit configured to generate an orthogonal frequency division multiplexed (OFDM) or frequency division multiple access (FDMA) signal; and
 a pre-distortion circuit configured to:
  generate a periodic pre-distortion signal, wherein a period of the pre-distortion signal is synchronized to the period of said OFDM or FDMA signal; and
  combine said periodic pre-distortion signal with said OFDM or FDMA signal, resulting in a pre-distorted signal.

27. The transmitter of claim 26, further comprising at least one nonlinear circuit and a nonlinear distortion modeling circuit, wherein:
 said at least one nonlinear circuit comprises a power amplifier and a digital nonlinear function circuit; and
 said nonlinear distortion modeling circuit is configured to model nonlinear distortion introduced by said at least one nonlinear circuit.

\* \* \* \* \*